United States Patent
Ko et al.

(10) Patent No.: US 12,538,711 B2
(45) Date of Patent: Jan. 27, 2026

(54) METHOD FOR FORMING A HARD MASK WITH A TAPERED PROFILE

(71) Applicant: Taiwan Semiconductor Manufacturing Company, Ltd., Hsinchu (TW)

(72) Inventors: Min-Yung Ko, Hsinchu (TW); Chern-Yow Hsu, Chu-Bei (TW); Chang-Ming Wu, New Taipei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/772,350

(22) Filed: Jul. 15, 2024

(65) Prior Publication Data

US 2024/0373755 A1    Nov. 7, 2024

Related U.S. Application Data

(60) Continuation of application No. 18/353,254, filed on Jul. 17, 2023, now Pat. No. 12,114,576, which is a
(Continued)

(51) Int. Cl.
*H10N 50/01* (2023.01)
*H10B 61/00* (2023.01)
(Continued)

(52) U.S. Cl.
CPC ............. *H10N 50/01* (2023.02); *H10B 61/22* (2023.02); *H10B 63/30* (2023.02); *H10N 50/10* (2023.02);
(Continued)

(58) Field of Classification Search
CPC ...... H10N 50/01; H10N 70/021; H10N 50/80; H10N 70/841; H10N 70/063; H10N 70/068; H10N 50/10; H10B 63/30; H10B 61/22
(Continued)

(56) References Cited

U.S. PATENT DOCUMENTS 9,905,282 B1 * 2/2018 Yi .................... H01F 41/303
10,032,828 B2   7/2018 Chuang et al.
(Continued)

OTHER PUBLICATIONS

Non-Final Office Action dated Jan. 20, 2023 for U.S. Appl. No. 17/078,630.
(Continued)

*Primary Examiner* — Jami Valentine Miller
(74) *Attorney, Agent, or Firm* — Eschweiler & Potashnik, LLC

(57) ABSTRACT

Various embodiments of the present disclosure are directed towards a method for forming a memory cell. In some embodiments, a memory film is deposited over a substrate and comprises a bottom electrode layer, a top electrode layer, and a data storage film between the top and bottom electrode layers. A hard mask film is deposited over the memory film and comprises a conductive hard mask layer. The top electrode layer and the hard mask film are patterned to respectively form a top electrode and a hard mask over the top electrode. A trimming process is performed to decrease a sidewall angle between a sidewall of the hard mask and a bottom surface of the hard mask. An etch is performed into the data storage film with the hard mask in place after the trimming process to form a data storage structure underlying the top electrode.

20 Claims, 16 Drawing Sheets

Related U.S. Application Data division of application No. 17/078,630, filed on Oct. 23, 2020, now Pat. No. 11,765,980.

(60) Provisional application No. 63/072,343, filed on Aug. 31, 2020.

(51) Int. Cl.
| | |
|---|---|
| *H10B 63/00* | (2023.01) |
| *H10N 50/10* | (2023.01) |
| *H10N 50/80* | (2023.01) |
| *H10N 70/00* | (2023.01) |

(52) U.S. Cl.
CPC .......... *H10N 50/80* (2023.02); *H10N 70/021* (2023.02); *H10N 70/063* (2023.02); *H10N 70/068* (2023.02); *H10N 70/841* (2023.02)

(58) Field of Classification Search
USPC ........................................................ 257/421
See application file for complete search history.

(56) References Cited

U.S. PATENT DOCUMENTS

| | | | |
|---|---|---|---|
| 10,134,981 | B1 | 11/2018 | Yang et al. |
| 10,418,547 | B1 | 9/2019 | Yang et al. |
| 10,475,991 | B2 | 11/2019 | Yang et al. |
| 10,790,439 | B2 * | 9/2020 | Ku .................... H01L 23/5283 |
| 11,211,489 | B2 * | 12/2021 | Doyle .................. H10D 64/689 |
| 11,362,277 | B2 * | 6/2022 | Lin ...................... H10N 70/231 |
| 2007/0020934 | A1 | 1/2007 | Gaidis et al. |
| 2010/0097846 | A1 | 4/2010 | Sugiura et al. |
| 2014/0070343 | A1 * | 3/2014 | Fukatsu ................ H10N 50/10 |
| | | | 257/421 |
| 2014/0264222 | A1 * | 9/2014 | Yang ................ H01L 21/26513 |
| | | | 438/238 |
| 2018/0033957 | A1 | 2/2018 | Zhang et al. |
| 2018/0204719 | A1 | 7/2018 | Ma et al. |
| 2020/0006644 | A1 | 1/2020 | Zhao et al. |
| 2020/0066972 | A1 | 2/2020 | Yang et al. |
| 2020/0127049 | A1 * | 4/2020 | Kalnitsky ............. H10N 50/10 |
| 2020/0144172 | A1 * | 5/2020 | Chen .................. H01L 23/5226 |
| 2020/0203598 | A1 * | 6/2020 | Garello ................ H10N 50/80 |
| 2021/0083178 | A1 * | 3/2021 | Hsu ..................... H10N 50/10 |
| 2021/0134668 | A1 * | 5/2021 | Huang .................. H10B 61/22 |
| 2021/0202841 | A1 * | 7/2021 | Good .................. H10N 70/041 |
| 2021/0287727 | A1 * | 9/2021 | Tsubata ................ G11C 11/161 |
| 2021/0376232 | A1 | 12/2021 | Wang et al. |
| 2022/0069204 | A1 * | 3/2022 | Ko ....................... H10N 50/10 |
| 2022/0131070 | A1 * | 4/2022 | Lin ...................... H10N 50/01 |
| 2024/0290810 | A1 * | 8/2024 | Chung ................. H10F 39/811 |

OTHER PUBLICATIONS

Notice of Allowance dated May 10, 2023 for U.S. Appl. No. 17/078,630.

Non-Final Office Action dated Jan. 31, 2024 for U.S. Appl. No. 18/353,254.

Notice of Allowance dated Jun. 6, 2024 for U.S. Appl. No. 18/353,254.

* cited by examiner

METHOD FOR FORMING A HARD MASK WITH A TAPERED PROFILE

REFERENCE TO RELATED APPLICATIONS

This Application is a Continuation of U.S. application Ser. No. 18/353,254, filed on Jul. 17, 2023, which is a Divisional of U.S. application Ser. No. 17/078,630, filed on Oct. 23, 2020 (now U.S. Pat. No. 11,765,980, issued on Sep. 19, 2023), which claims the benefit of U.S. Provisional Application No. 63/072,343, filed on Aug. 31, 2020. The contents of the above-referenced patent applications are hereby incorporated by reference in their entirety.

BACKGROUND

Many modern-day electronic devices include electronic memory. Electronic memory may be volatile memory or non-volatile memory. Non-volatile memory is able to store data in the absence of power, whereas volatile memory is not. Magnetoresistive random-access memory (MRAM) and resistive random-access memory (RRAM) are promising candidates for next generation non-volatile memory due to relatively simple structures and compatibility with complementary metal-oxide-semiconductor (CMOS) manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
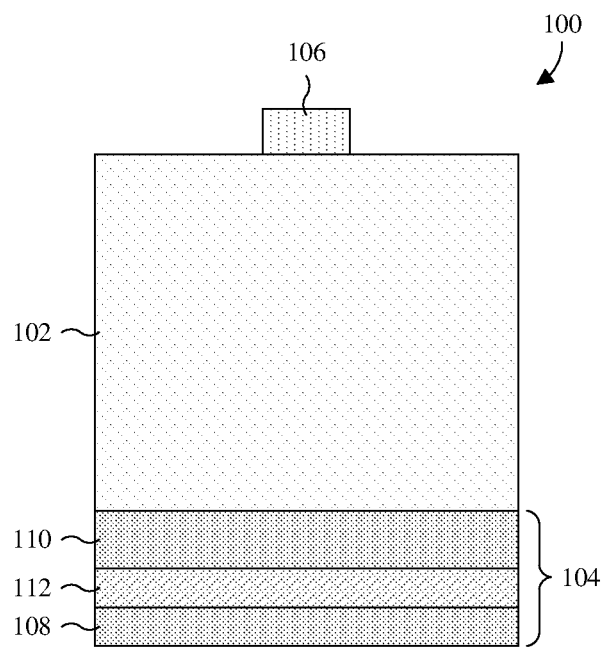
FIGS. 1-4 illustrate a series of cross-sectional views of some embodiments of a method for forming and using a hard mask with a tapered profile.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An magnetoresistive random-access memory (MRAM) cell may comprise a magnetic tunnel junction (MTJ) vertically between a bottom electrode and a top electrode. According to some methods for forming the MRAM cell, a memory film is deposited over a substrate. The memory film comprises a bottom electrode layer, a top electrode layer, and an MTJ film vertically between the top and bottom electrode layers. A hard mask film is deposited over the memory film, and a photoresist mask is formed over the hard mask film. A first dry etch is performed into the hard mask film and the top electrode layer with the photoresist mask in place. The first dry etch stops on the MTJ film. Further, the first dry etch forms a hard mask and a top electrode underlying the hard mask respectively from the hard mask film and the top electrode layer. A second dry etch is performed into the MTJ film with the hard mask and the top electrode in place to form an MTJ underlying the top electrode and the hard mask. Further, a spacer layer is deposited covering, and lining sidewalls of, the MTJ.

At least when the MTJ is formed with a small width less than about 65 nanometers or some other suitable value, the hard mask may comprise a metal hard mask layer and a small width similar to the MTJ width. Further, the hard mask may have a large ratio of height to width and a sidewall that is substantially orthogonal to a bottom surface of the hard mask. Because of the large ratio, the small width, and the substantially orthogonal sidewall, the hard mask may be structurally weak. As a result, the hard mask may be prone to bending and/or collapse. This may decrease yields and/or width uniformity when forming the MTJ in bulk. Also because of the substantially orthogonal sidewall, ions used during the second dry etch may have a low likelihood of impinging on the sidewall. This may be known as the shielding effect. Because of the low likelihood, removal efficiency of etched material along the sidewall may be low and redeposition of etched material along the sidewall may be high. Because the etched material may include conductive material, the redeposition may form a conductive bridge between fixed and free elements of the MTJ. This may lead to increased leakage current between the fixed and free elements and may hence decrease yields when forming the MTJ in bulk.

Various embodiments of the present disclosure are directed towards a method for forming a hard mask with a tapered profile, as well as a method for forming a memory cell with the hard mask and the resulting memory cell. According to some embodiments of the method for forming the hard mask, a hard mask film comprising a conductive hard mask layer is deposited. A photoresist mask is formed over the hard mask film. An etch is performed into the hard mask film with the photoresist mask in place to form the hard mask. The etch forms the hard mask with a sidewall that is substantially orthogonal to a bottom surface of the hard mask. A trimming process is performed using ion bombardment to decrease an angle between the sidewall and the bottom surface. As a result, a hard mask profile becomes more tapered from bottom to top. In other words, the hard mask profile decreases in width from bottom to top at a greater rate.

Because the trimming process increases the taper of the hard mask profile, ions have a higher likelihood of impinging on the sidewall of the hard mask during etching to form a data storage structure underlying the hard mask. The data storage structure may, for example, be or otherwise include an MTJ or some other suitable type of data storage structure. Because of the higher likelihood of ion impingement, removal efficiency of etched material along the sidewall of the hard mask may be higher and redeposition of etched material along the sidewall of the hard mask may be lower. The higher removal efficiency and the lower sidewall redeposition may reduce leakage current and may hence increase yields when the data storage structure is formed in bulk. For example, when the data storage structure is an MTJ, the lower sidewall redeposition may reduce the likelihood of sidewall redeposition causing conductive bridging between fixed and free elements of the MTJ and may hence minimize leakage current between the fixed and free elements.

Also, because the trimming process increases the taper of the hard mask profile, the hard mask has less mass along a top of the hard mask. Accordingly, the hard mask is structurally stronger and less prone to bending and/or collapse. This, in turn, may increase yields and/or width uniformity when forming a data storage structure in bulk using the hard mask.

With reference to FIGS. 1-4, a series of cross-sectional views 100-400 of some embodiments of a method for forming and using a hard mask with a tapered profile is provided. The method finds application with forming a memory cell or some other suitable type of cell. For example, the method may be performed to form the hard mask and to use the hard mask to form a MTJ or some other suitable type of data storage structure of a memory cell.

As illustrated by the cross-sectional view 100 of FIG. 1, a hard mask film 102 is deposited over a memory film 104. Further, a photoresist mask 106 is formed over the memory film 104. The memory film 104 comprises a bottom electrode layer 108, a top electrode layer 110, and a data storage film 112 between the bottom and top electrode layers 108, 110. In some embodiments, the hard mask film 102 is or comprise a conductive (e.g., metal or metal-containing) layer. The data storage film 112 may, for example, be or comprise an MTJ film, a resistive random-access memory (RRAM) film, or some other suitable data storage film. The RRAM film may, for example, be or comprise a metal oxide and/or some other material(s).

Figure 2:
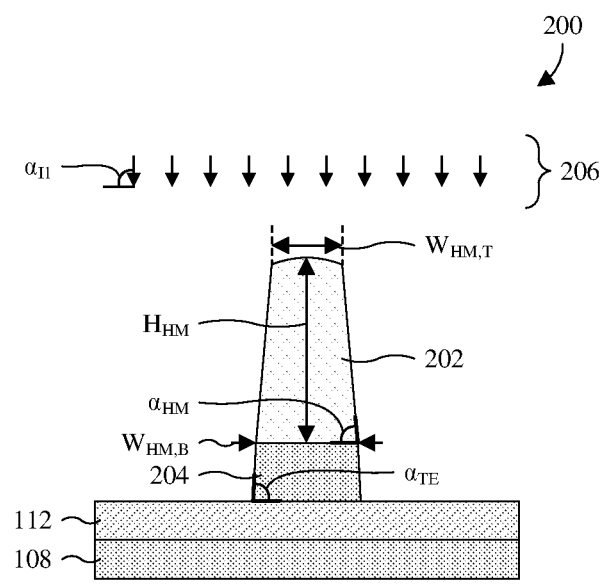

As illustrated by the cross-sectional view 200 of FIG. 2, a first etch is performed into the hard mask film 102 (see, e.g., FIG. 1) and the top electrode layer 110 (see, e.g., FIG. 1) with the photoresist mask 106 (see, e.g., FIG. 1) in place. The first etch removes the photoresist mask 106 and forms a hard mask 202 and a top electrode 204 respectively from the hard mask film 102 and the top electrode layer 110. Further, the first etch stops on the data storage film 112. In alternative embodiments, the first etch stops on the top electrode layer 110. Compared to the hard mask film 102, the hard mask 202 has a lesser height $H_{HM}$.

In some embodiments, the first etch is performed by anisotropic and/or dry etching. For example, the first etch may bombard the hard mask film 102 and the top electrode layer 110 with ions 206 accelerated in a direction orthogonal or substantially orthogonal to individual bottom surfaces respectively of the hard mask 202 and the top electrode 204. By substantially orthogonal, it is meant that the direction is at an angle $\alpha_{f1}$ relative to the bottom surfaces and that the angle $\alpha_{f1}$ is within about 5 degrees or some other suitable value of 90 degrees. In some embodiments, orthogonal or substantially orthogonal may also be regarded respectively as vertical or substantially vertical. In some embodiments, the ions 206 are sourced from plasma generated from methanol (e.g., $CH_3OH$) gas and/or some other suitable gas. In some embodiments, the anisotropic and/or dry etching is or comprises inductively coupled (ICP) reactive ion etching (RIE). In other embodiments, the first etch is performed by some other suitable type of etching besides anisotropic and/or dry etching.

Upon completion of the first etch, the hard mask 202 and the top electrode 204 have individual sidewalls that are substantially orthogonal to the bottom surfaces respectively of the hard mask 202 and the top electrode 204. By substantially orthogonal, it is meant that the sidewalls are at individual angles $\alpha_{HM}$, $\alpha_{TE}$ respectively relative to the bottom surfaces and that the angles $\alpha_{HM}$, $\alpha_{TE}$ are within about 5 degrees or some other suitable value of 90 degrees. As above, in some embodiments, orthogonal or substantially orthogonal may also be regarded respectively as vertical or substantially vertical. In some embodiments, the angle $\alpha_{TE}$ of the top electrode 204 is greater than the angle $\alpha_{HM}$ of the hard mask 202. For example, the angle $\alpha_{TE}$ of the top electrode 204 may be about 87 degrees, whereas the angle $\alpha_{HM}$ of the hard mask 202 may be about 85 degrees. Other suitable values are, however, amenable. The hard mask 202 and the top electrode 204 may, for example, have profiles that are trapezoidal or some other suitable shape.

In some embodiments, the hard mask 202 has a ratio of bottom width $W_{HM,B}$ to top width $W_{HM,T}$ that is about 1.4-1.8, about 1.64, or some other suitable value. The bottom width $W_{HM,B}$ is at a bottom sidewall edge of the hard mask 202, and the top width $W_{HM,T}$ is at a top sidewall edge of the hard mask 202. In some embodiments, the bottom width $W_{HM,B}$ of the hard mask 202 and/or the top width $W_{HM,T}$ of the hard mask 202 is/are small. For example, the bottom width $W_{HM,B}$ and/or the top width $W_{HM,T}$ may be less than about 65 nanometers, about 55 nanometers, or some other suitable value and/or may be about 55-65 nanometers, about 45-65 nanometers, or some other suitable value. In some embodiments, the hard mask 202 has a large ratio of height $H_{HM}$ to bottom and/or top width $W_{HM,B}$, $W_{HM,T}$. For example, the ratio may be more than about 4, about 5, or some other suitable value and/or may be between about 3-5, about 4-6, or some other suitable value.

Figure 3:
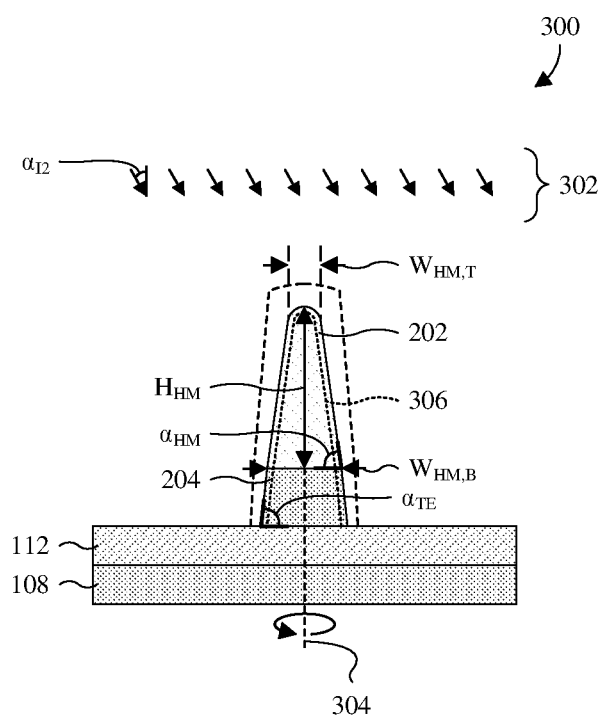

As illustrated by the cross-sectional view 300 of FIG. 3, a trimming process is performed to decrease the angles $\alpha_{HM}$, $\alpha_{TE}$ between the sidewalls and the bottom surfaces, such that the hard mask 202 and the top electrode 204 have profiles that are more tapered from bottom to top. In other words, the hard mask profile and the top electrode profile decrease in width from bottom to top at greater rates than before the trimming process. Note that an outline of the hard mask 202 and the top electrode 204 before the trimming process is shown in phantom. In some embodiments, the trimming process further smooths the sidewalls. The hard mask 202 and the top electrode 204 may, for example, have profiles that are trapezoidal or some other suitable shape. The trimming process may, for example, be performed by ion beam etching (IBE) or some other suitable type of trimming process.

In some embodiments, the angle $\alpha_{HM}$ of the hard mask 202 is less than about 82 degrees, is about 75-82 degrees, or is some other suitable value. As described hereafter, if the angle $\alpha_{HM}$ is too great (e.g., greater than about 82 degrees or some other suitable value), the hard mask 202 may shield ions during subsequent etching, thereby reducing sidewall cleaning efficiency and increasing sidewall redeposition. This may lead to increased leakage current and decreased yields. In some embodiments, the angle $\alpha_{HM}$ of the hard mask 202 is less than the angle $\alpha_{TE}$ of the top electrode 204. For example, the angle $\alpha_{HM}$ of the hard mask 202 may be about 82 degrees, whereas the angle $\alpha_{TE}$ of the top electrode 204 may be about 84 degrees. Other suitable values are, however, amenable.

In some embodiments, the trimming process increases the ratio of bottom width $W_{HM,B}$ to top width $W_{HM,T}$. In some embodiments, the ratio is about 1.8-2 or some other suitable value upon completion of the trimming process. In some embodiments, the ratio is about 1.64 before the trimming process and is about 2 after the trimming process. Other suitable values are, however, amenable.

In embodiments in which the trimming process is performed by IBE, the angles $\alpha_{HM}$, $\alpha_{TE}$ between the sidewalls and the bottom surfaces are decreased by bombarding the sidewalls with ions 302. Further, the structure of FIG. 3 is rotated about a central axis 304 so as to bombard the sidewalls from different angles. The central axis 304 is orthogonal to the bottom surfaces respectively of the hard mask 202 and the top electrode 204 and, in some embodiments, corresponds to vertical. In some embodiments, the ions 302 are sourced from plasma formed from an inert gas. The inert gas may, for example, be or comprise helium, argon, krypton, xenon, some other suitable inert gas(s), or any combination of the foregoing. In other embodiments, the ions 302 are sourced from plasma formed from a chemically reactive gas. In some embodiments, some of the ions 302 become embedded in the sidewalls to define regions 306 lining the sidewalls. The regions 306 have an elevated concentration of the ions 302 relative to remainders of the hard mask 202 and the top electrode 204. In other embodiments, none or a negligible amount of the ions 302 become embedded in the sidewalls and hence the regions 306 are omitted.

In some embodiments, the bombardment persists for about 60-80 seconds or some other suitable amount of time. If the bombardment persists for too little time (e.g., less than about 60 seconds or some other suitable amount of time), profiles may not be tapered enough to alleviate the above described concerns regarding the shielding effect and the structural integrity of the hard mask 202. If the bombardment persists for too much time (e.g., more than about 80 seconds or some other suitable amount of time), too much of the hard mask 202 may be removed and the hard mask 202 may be insufficient for subsequent etching.

In some embodiments, the ions 302 bombard the sidewalls at an angle $\alpha_{I2}$ that is acute and that is relative to the central axis 304. The angle $\alpha_{I2}$ is less than the angle $\alpha_{I1}$ used during the first etch (see, e.g., FIG. 2) and may, for example, be about 35-90 degrees, about 30 degrees, about 50 degrees, or some other suitable value. In some embodiments, the angle $\alpha_{I2}$ is fixed during the trimming process. In other embodiments, the angle $\alpha_{I2}$ varies continuously or discretely during the trimming process. In some embodiments, the angle $\alpha_{I2}$ is about 50 degrees and the ion bombardment persists for about 70 seconds.

Figure 5:
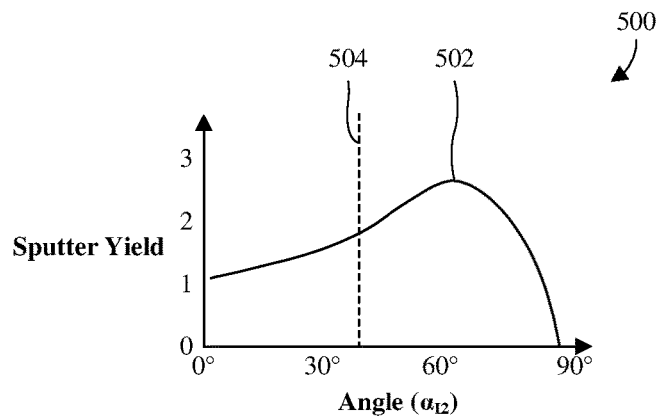
FIG. 5 illustrates a graph of some embodiments of a curve describing sputter yield as a function of ion angle during ion bombardment of FIG. 3.

With reference to FIG. 5, a graph 500 of some embodiments of a curve 502 describing sputter yield as a function of the angle $\alpha_{I2}$ is provided. Sputter yield refers to the amount of particles ejected or removed from the hard mask 202 and the top electrode 204 in response to bombardment by the ions 302. It has been appreciated that when the angle $\alpha_{I2}$ is greater than about 35 degrees (demarcated by a threshold 504), is about 35-90 degrees, or is some other suitable value, the removal rate may exceed the redeposition rate. This prevents sidewall redeposition along a bottom of the hard mask 202 and/or a bottom of the top electrode 204.

Referring back to FIGS. 1-4, and as illustrated by the cross-sectional view 400 of FIG. 4, a second etch is performed into the data storage film 112 (see, e.g., FIG. 3) with the hard mask 202 in place. The second forms a data storage structure 402 respectively from the data storage film 112. For example, when the data storage film 112 is or comprises an MTJ film, the second etch may form an MTJ from the data storage film 112. Further, the second etch stops on the bottom electrode layer 108. In alternative embodiments, the second etch is also into the bottom electrode layer 108 to form a bottom electrode.

Compared to FIG. 3, the hard mask 202 has a lesser height HHM. In some embodiments, the hard mask 202 has a height of about 150 angstroms or some other suitable value. In some embodiments, the data storage structure 402 has a width $W_{DS}$ that is about 40-65 nanometers, that is less than about 55 nanometers, or that is some other suitable value. In some embodiments, the second etch decreases the angle $\alpha_{TE}$ between the sidewall of the top electrode 204 and the bottom surface of the top electrode 204 and/or decreases the angle $\alpha_{HM}$ between the sidewall of the hard mask 202 and the bottom surface of the hard mask 202. For example, the angle $\alpha_{TE}$ may be decreased from about 84 degrees to about 80 degrees.

In some embodiments, the second etch is performed by anisotropic and/or dry etching. For example, the second etch may bombard the data storage film 112 with ions 404 accelerated in a direction orthogonal to or substantially orthogonal to individual bottom surfaces respectively of the hard mask 202 and the top electrode 204. By substantially orthogonal, it is meant that the direction is at an angle $\alpha_{I3}$ relative to the bottom surfaces and that the angle $\alpha_{I3}$ is within about 5 degrees or some other suitable value of 90 degrees. In some embodiments, orthogonal or substantially orthogonal may also be regarded respectively as vertical or substantially vertical. In some embodiments, the angle $\alpha_{I3}$ is the same as the angle $\alpha_{I1}$ of FIG. 2. Further, in some embodiments, the angle $\alpha_{t3}$ is greater than the angle $\alpha_{t2}$ of FIG. 3. In some embodiments, the anisotropic and/or dry etching is or comprises ICP RIE. In other embodiments, the second etch is performed by some other suitable type of etching besides anisotropic and/or dry etching.

Because the trimming process increases the taper of the hard mask 202, the hard mask 202 has less mass along a top of the hard mask 202. As a result, the hard mask 202 is structurally stronger and less prone to bending and/or collapse. This increases yields and/or width uniformity when the data storage structure 402 is formed in bulk using the hard mask 202. Further, because the trimming process increases the taper of the hard mask 202, the ions 404 have a higher likelihood of impinging on the sidewall of the hard mask 202 and/or the sidewall of the top electrode 204. Accordingly, removal efficiency of etched material along the sidewalls is higher and redeposition of etched material along the sidewalls is lower. At least when the data storage structure 402 is or comprises an MTJ, sidewall redeposition may include conductive material that may form a conductive bridge increasing leakage current between fixed and free elements of the MTJ. The conductive material may, for example, be metallic and/or may, for example, include titanium, ruthenium, tantalum, some other suitable material(s), or any combination of the foregoing. Therefore, because of the higher removal efficiency and the lower sidewall redeposition, leakage current from sidewall redeposition may be lower. Further, yields may be higher when the data storage structure 402 is formed in bulk using the hard mask 202.

While FIGS. 1-4 are described with reference to a method, it will be appreciated that the structures shown in FIGS. 1-4 are not limited to the method but rather may stand alone separate of the method. While FIGS. 1-4 are described as a series of acts, it will be appreciated that the order of the acts may be altered in other embodiments. While FIGS. 1-4 illustrate and describe as a specific set of acts, some acts that are illustrated and/or described may be omitted in other embodiments. Further, acts that are not illustrated and/or described may be included in other embodiments.

Figure 6:
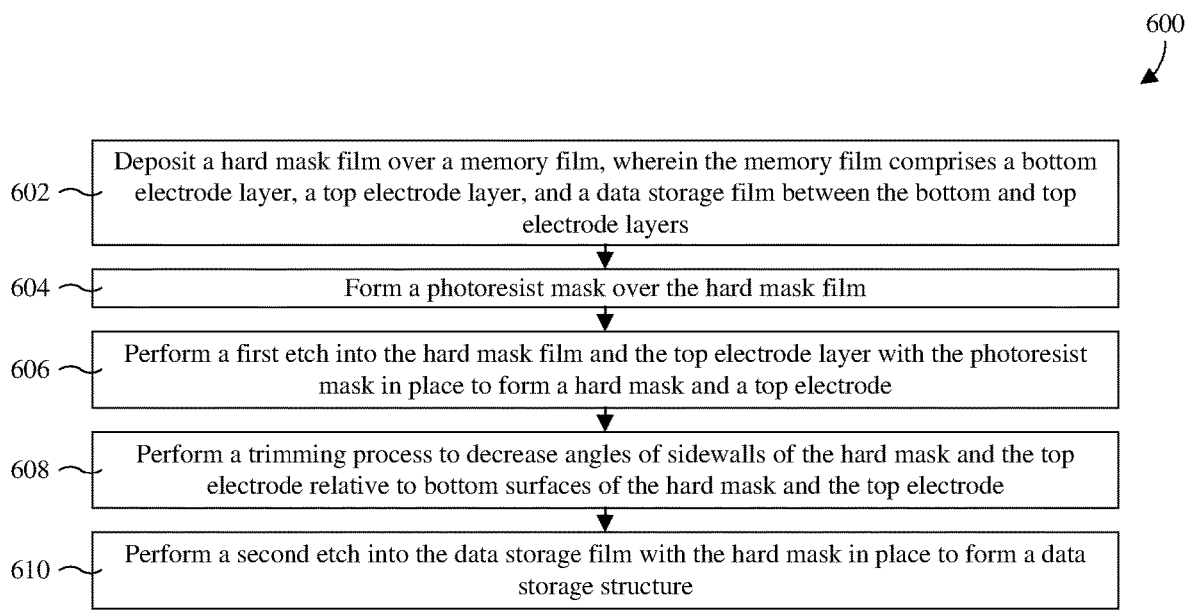
FIG. 6 illustrates a block diagram of some embodiments of the method of FIGS. 1-4.

With reference to FIG. 6, a block diagram 600 of some embodiments of the method of FIGS. 1-4 is provided.

At 602, a hard mask film is deposited over a memory film, wherein the memory film comprises a bottom electrode layer, a top electrode layer, and a data storage film between the bottom and top electrode layers. See, for example, FIG. 1. The data storage film may, for example, be or comprise an MTJ film or some other suitable type of data storage film.

At 604, a photoresist mask is formed over the hard mask film. Sec, for example, FIG. 1.

At 606, a first etch is performed into the hard mask film and the top electrode layer with the photoresist mask in place to form a hard mask and a top electrode. See, for example, FIG. 2.

At 608, a trimming process is performed to decrease angles of sidewalls of the hard mask and the top electrode relative to bottom surfaces of the hard mask and the top electrode. See, for example, FIG. 3. The trimming process may, for example, be performed by IBE or some other suitable type of trimming process.

At 610, a second etch is performed into the data storage film with the hard mask in place to form a data storage structure. See, for example, FIG. 4. The data storage structure may, for example, be or comprise an MTJ or some other suitable type of data storage structure.

As described above, the trimming process at 608 increases a taper of the hard mask from bottom to top. This reduces the likelihood of bending and/or collapse and further reduces the likelihood of etch redeposition during the second etch. The reduced likelihood of bending and/or collapse, in turn, increases uniformity of the data storage structure and yields when the data storage structure is formed in bulk. The reduced likelihood of etch redeposition, in turn, reduces leakage current and increases yields when the data storage structure is formed in bulk.

While the block diagram 600 of FIG. 6 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 7:
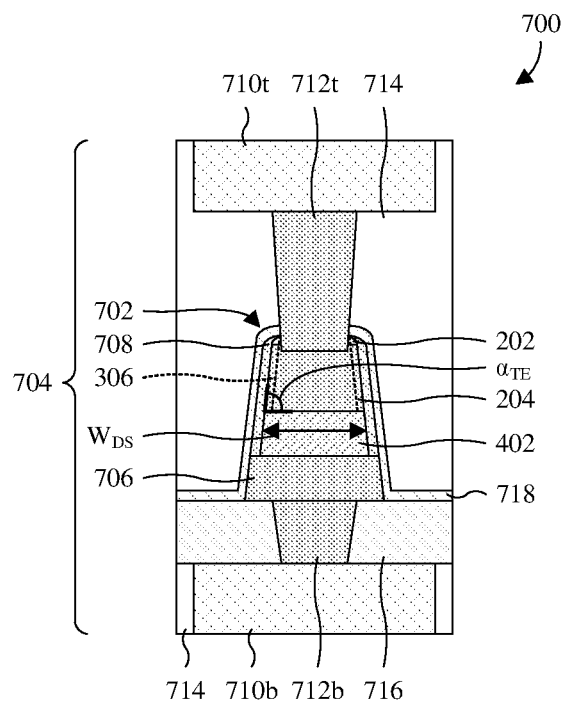
FIG. 7 illustrates a cross-sectional view of some embodiments of an integrated circuit (IC) comprising a memory cell formed using the method of FIGS. 1-4.

With reference to FIG. 7, a cross-sectional view 700 of some embodiments of an integrated circuit (IC) comprising a memory cell 702 formed using the method of FIGS. 1-4 is provided. Note that the IC is only partially shown but is more completely shown hereafter. The memory cell 702 is in an interconnect structure 704 of the IC and comprises a bottom electrode 706, a top electrode 204, and a data storage structure 402 vertically between the bottom and top electrodes 706, 204. The memory cell 702 may, for example, be or comprise an MRAM cell, an RRAM cell, or some other suitable type of memory cell. In embodiments in which the memory cell 702 is an MRAM cell, the data storage structure 402 is or comprises an MTJ.

In some embodiments, the angle $\alpha_{TE}$ between a sidewall of the top electrode 204 and a bottom surface of the top electrode 204 is less than about 82 degrees, is about 75-82 degrees, or is some other suitable value. In some embodiments, the data storage structure 402 and the top electrode 204 define a common sidewall that is smooth from top to bottom.

The hard mask 202 overlies the top electrode 204, and a sidewall spacer 708 overlies the bottom electrode 706 on sidewalls of the data storage structure 402 and the top electrode 204. In alternative embodiments, the hard mask 202 is omitted. In alternative embodiments, the sidewall spacer 708 is also on a sidewall of the bottom electrode 706. The hard mask 202 comprises dielectric material and, in some embodiments, further comprises metal and/or some other suitable conductive material. The sidewall spacer 708 may, for example, be or comprise silicon nitride and/or some other suitable dielectric(s).

A bottom electrode wire 710b underlies the memory cell 702, and a top electrode wire 710t overlies the memory cell 702. Further, a bottom electrode via (BEVA) 712b extends from the bottom electrode wire 710b to the bottom electrode 706, and a top electrode via (TEVA) 712t extends from the top electrode wire 710t to the top electrode 204 through the hard mask 202. The bottom electrode wire 710b, the top electrode wire 710t, the BEVA 712b, and the TEVA 712t are conductive and may, for example, be or comprise metal and/or some other suitable conductive material(s).

A plurality of intermetal dielectric (IMD) layers 714, a via dielectric layer 716, and an etch stop layer 718 are stacked upon each other and surround the memory cell 702, the bottom and top electrode wires 710b, 710t, the BEVA 712b, and the TEVA 712t. The via dielectric layer 716 and the etch stop layer 718 may, for example, be or comprise silicon carbide and/or some other suitable dielectric(s). The IMD layers 714 may, for example, be or comprise oxide and/or some other suitable dielectric(s).

Figure 8:
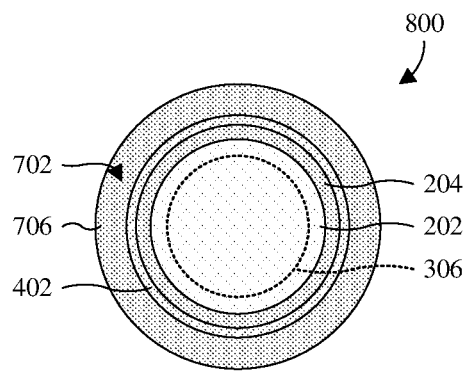
FIG. 8 illustrates a top view of some embodiments of the memory cell of FIG. 7.

With reference to FIG. 8, a top view 800 of some embodiments of the memory cell 702 of FIG. 7 is provided in which constituents of the memory cell 702 have circular top layouts. In alternative embodiments, the constituents are square shaped, rectangular, oval shaped, or some other suitable shape. Note that FIG. 8 focuses on the memory cell 702 and hence does not illustrate surrounding structure (e.g., the sidewall spacer 708) from FIG. 7.

Figure 9:
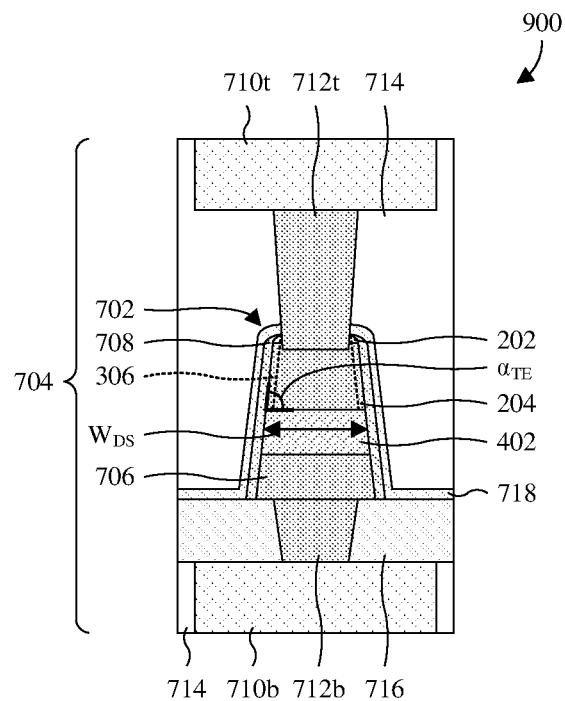
FIG. 9 illustrates a cross-sectional view of some alternative embodiments of the IC of FIG. 7 in which a sidewall spacer is on a sidewall of a bottom electrode.

With reference to FIG. 9, a cross-sectional view 900 of some alternative embodiments of the IC of FIG. 7 is provided in which the sidewall spacer 708 is on a sidewall of the bottom electrode 706. Such embodiments may, for example, be achieved by extending the second etch of FIG. 4 into the bottom electrode layer 108.

Figure 10:
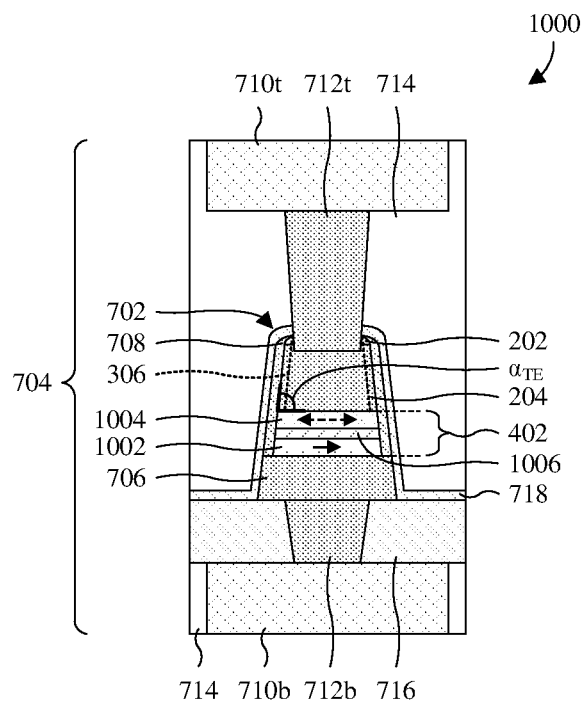
FIG. 10 illustrates a cross-sectional view of some alternative embodiments of the IC of FIG. 7 in which the memory cell comprises a magnetic tunnel junction (MTJ).

With reference to FIG. 10, a cross-sectional view 1000 of some alternative embodiments of the IC of FIG. 7 is provided in which the data storage structure 402 is or comprises a MTJ. As such, the data storage structure 402 comprises a fixed element 1002, a free element 1004 over the fixed element 1002, and a barrier element 1006 vertically between the fixed and free elements 1002, 1004. In alternative embodiments, the free element 1004 is under the fixed element 1002. The fixed and free elements 1002, 1004 are ferromagnetic. Further, the fixed element 1002 has a magnetization that is fixed, whereas the free element 1004 has a magnetization that is "free" to change and that is used to represent data. Note that the magnetizations are schematically illustrated by horizontal arrows. However, the arrows may alternatively be vertical in alternative embodiments. The barrier element 1006 is non-magnetic and is sandwiched between the fixed and free elements 1002, 1004.

During operation, the barrier element 1006 selectively allows quantum mechanical tunneling of electrons through the barrier element 1006. When the magnetizations of the fixed and free elements 1002, 1004 are antiparallel, quantum mechanical tunneling may be blocked. As such, the data storage structure 402 may have a high resistance and may be in the first data state. When the magnetizations of the fixed and free elements 1002, 1004 are parallel, quantum mechanical tunneling may be allowed. As such, the data storage structure 402 may have a low resistance and may be in the second data state.

The barrier element 1006 may, for example, be or comprise an amorphous barrier, a crystalline barrier, or some other suitable insulating and/or tunnel barrier material. The amorphous barrier may be or comprise, for example, aluminum oxide (e.g., $AlO_x$), titanium oxide (e.g., $TiO_x$), or some other suitable amorphous barrier. The crystalline barrier may, for example, be or comprise manganese oxide (e.g., MgO), spinel (e.g., $MgAl_2O_4$), or some other suitable crystalline barrier. The fixed element 1002 and/or the free element 1004 may, for example, be or comprises cobalt iron (e.g., CoFc), cobalt iron boron (e.g., CoFeB), some other suitable ferromagnetic material(s), or any combination of the foregoing.

Figure 11:
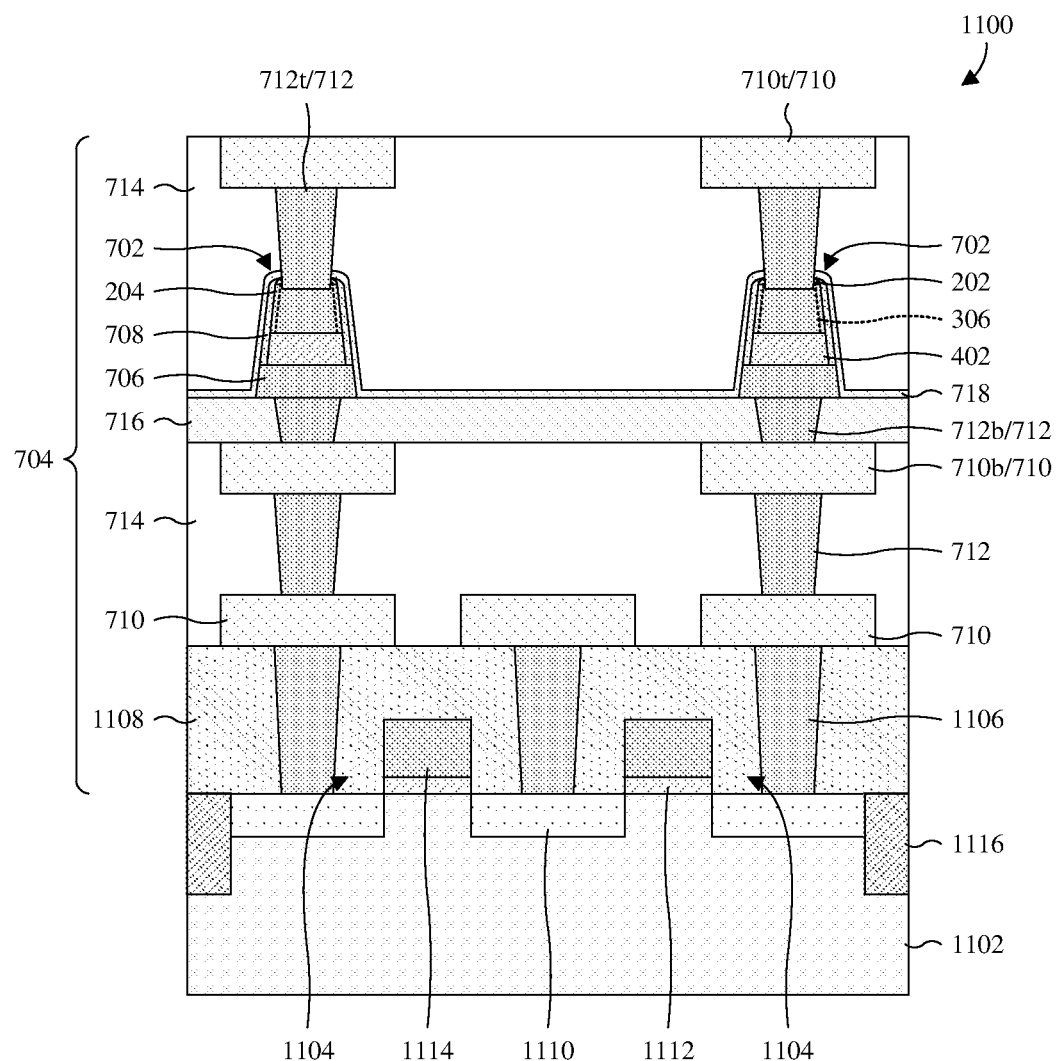
FIG. 11 illustrates a cross-sectional view of some embodiments of an IC comprising a plurality of memory cells formed using the method of FIGS. 1-4.

With reference to FIG. 11, a cross-sectional view 1100 of some embodiments of an IC comprising a plurality of memory cells 702 formed using the method of FIGS. 1-4 is provided. The memory cells 702 overlie a substrate 1102 in an interconnect structure 704 that electrically couples the memory cells 702 to individual access transistors 1104 respectively underlying the memory cells 702. The memory cells 702 are each as illustrated and described at FIG. 7 but may alternatively be as illustrated and described at FIG. 9 or FIG. 10.

The interconnect structure 704 comprises a plurality of wires 710, a plurality of vias 712, and a plurality of contacts 1106. The wires 710 and the vias 712 are grouped respectively into a plurality wire levels and a plurality of via levels alternatingly stacked over the contacts 1106, and the contacts 1106 extend from a bottommost wire level to the access transistors 1104, to define conductive paths electrically coupling the memory cells 702 to the access transistors 1104. The plurality of wires 710 comprises bottom electrode wires 710b individual to the memory cells 702, as well as top electrode wires 710t individual to the memory cells 702. Further, the plurality of vias 712 comprises BEVAs 712b individual to the memory cells 702, as well as TEVAs 712t individual to the memory cells 702. The wires 710 and the vias 712 are conductive and comprise metal and/or some other suitable conductive material(s).

An interlayer dielectric (ILD) layer 1108, a plurality of IMD layers 714, a via dielectric layer 716, and an etch stop layer 718 are stacked over the substrate 1102. The ILD layer 1108 surrounds the contacts 1106, whereas the IMD layers 714, the via dielectric layer 716, and the etch stop layer 718 surround the memory cells 702, the wires 710, and the vias 712. The ILD layer 1108 may, for example, be or comprise oxide and/or some other suitable dielectric(s).

The access transistors 1104 are between the substrate 1102 and the interconnect structure 704. The access transistors 1104 may, for example, be metal-oxide-semiconductor field-effect transistors (MOSFETs), fin field-effect transistors (finFETs), gate-all-around field-effect transistors (GAA FETs) or some other suitable type of transistor. The substrate 1102 may, for example, be a bulk substrate of monocrystalline silicon, a silicon-on-insulator (SOI) substrate, or some other suitable type of semiconductor substrate.

In some embodiments, the access transistors 1104 comprise individual pairs of source/drain regions 1110, individual gate dielectric layers 1112, and individual gate electrodes 1114. The pairs of source/drain regions 1110 overlap, such that the access transistors 1104 share a source/drain region. In alternative embodiments, the pairs are non-overlapping. The source/drain regions 1110 are in the substrate 1102 and correspond to doped regions of the substrate 1102. In some embodiments, the source/drain regions 1110 have an opposite doping type as immediately adjoining regions of the substrate 1102. The gate dielectric layers 1112 are respectively stacked with the gate electrodes 1114 and each stack is sandwiched between the source/drain regions of a respective pair of source/drain regions 1110. The gate dielectric layers 1112 may, for example, be or comprise silicon oxide and/or some other suitable dielectric(s). The gate electrodes 1114 may, for example, be or comprise doped polysilicon, metal, some other suitable conductive material(s), or any combination of the foregoing.

A trench isolation structure 1116 surrounds the access transistors 1104. In alternative embodiments, the trench isolation structure 1116 further separates the access transistors 1104. Further, in such alternative embodiments, the access transistors 1104 no longer share a source/drain region. The trench isolation structure 1116 is or comprises silicon oxide and/or some other suitable dielectric(s). The trench isolation structure 1116 may, for example, be or comprise a shallow trench isolation (STI) structure, a deep trench isolation (DTI) structure, or some other suitable type of trench isolation structure.

While the sidewall spacers 708 overlie the bottom electrodes 706 as in FIG. 7, the sidewall spacers 708 may alternatively be on sidewalls of the bottom electrodes 706 as in FIG. 9. While the data storage structures 402 are illustrated as in FIG. 7, the data storage structures 402 may alternatively be as in FIG. 10. For example, the data storage structures 402 may comprise individual fixed elements, individual reference elements, and individual barrier layers.

With reference to FIGS. 12-20, a series of cross-sectional views 1200-2000 of some embodiments of a method for forming an IC comprising a plurality of memory cells is provided in which the memory cells are formed using hard masks with tapered profiles. The method may, for example, be employed to form the IC according to any one or combination of FIGS. 7-11. However, the method is illustrated using alternative embodiments of FIG. 11 in which the data storage structure 402 is as in FIG. 10. Further, the method may, for example, include forming the hard masks with the tapered profiles as in FIGS. 1-4.

Figure 12:
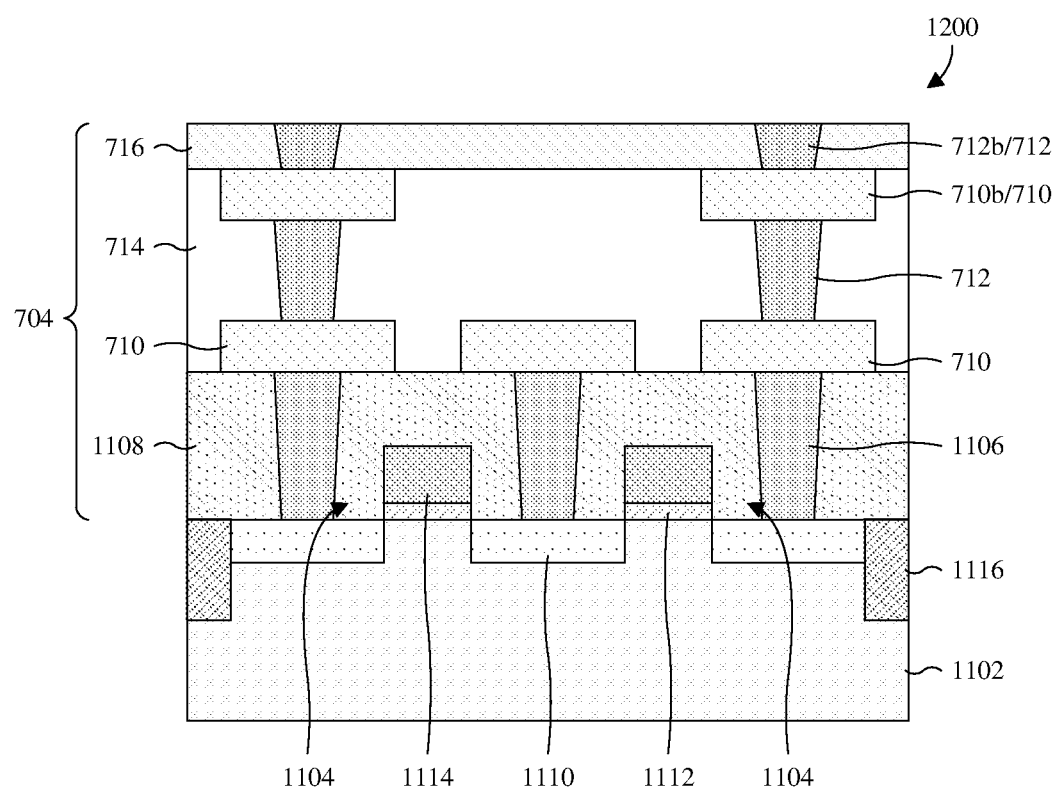
FIGS. 12-20 illustrate a series of cross-sectional views of some embodiments of a method for forming an IC comprising a plurality of memory cells in which the memory cells are formed using hard masks with tapered profiles.

As illustrated by the cross-sectional view 1200 of FIG. 12, a plurality of access transistors 1104 and a trench isolation structure 1116 are formed along a top of a substrate 1102. The substrate 1102, the access transistors 1104, and the trench isolation structure 1116 are as described with regard to FIG. 11. Hence, the access transistors 1104 share a source/drain region and are surrounded by the trench isolation structure 1116.

Also illustrated by the cross-sectional view 1200 of FIG. 12, an interconnect structure 704 is partially formed over and electrically coupled to the access transistors 1104. The interconnect structure 704 comprises a plurality of wires 710, a plurality of vias 712, and a plurality of contacts 1106. The wires 710 and the vias 712 are grouped respectively into a plurality of wire levels and a plurality of via levels alternatingly stacked over the contacts 1106. The contacts 1106 are in an ILD layer 1108, and a top level of the vias 712 is in a via dielectric layer 716. The wires 710 and a remainder of the vias 712 are in an IMD layer 714 between the ILD layer 1108 and the via dielectric layer 716. The top level of the vias 712 comprises a plurality of BEVAs 712b individual to and respectively electrically coupled to the access transistors 1104 by the wires 710, the contacts 1106, and a remainder of the vias 712. Similarly, a top level of the wires 710 comprises a plurality of bottom electrode wires 710b individual to and respectively electrically coupled to the access transistors 1104 by a remainder of the wires 710, underlying ones of the vias 712, and the contacts 1106.

Figure 13:
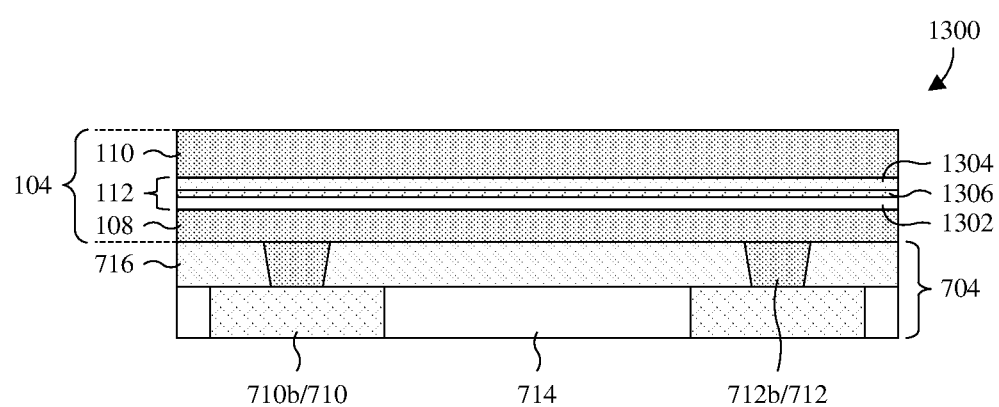

As illustrated by the cross-sectional view 1300 of FIG. 13, a memory film 104 is deposited over the interconnect structure 704. Note that only a top portion of the interconnect structure 704 is shown for drawing compactness. However, it is to be appreciated that structure underlying this top portion is as illustrated in FIG. 12. The memory film 104 comprises a bottom electrode layer 108, a top electrode layer 110, and a data storage film 112 vertically between the bottom and top electrode layers 108, 110. The data storage film 112 is an MTJ film and hence comprises a fixed layer 1302, a free layer 1304, and a barrier layer 1306 vertically between the fixed layer 1302 and the free layer 1304. In other embodiments, the data storage film 112 is an RRAM data storage film or some other suitable data storage film.

The bottom and top electrode layers 108, 110 are conductive and may, for example, be or comprise titanium, titanium nitride, tungsten, some other suitable conductive material(s), or any combination of the foregoing. The fixed and free layers 1302, 1304 are ferromagnetic and respectively have a fixed magnetization and a free magnetization. A free magnetization may, for example, be a magnetization that is free to change. The fixed and free layers 1302, 1304 may, for example, be or comprise cobalt iron (e.g., CoFe), cobalt iron boron (e.g., CoFeB), some other suitable ferromagnetic material(s), or any combination of the foregoing. The barrier layer 1306 may, for example, be or comprise an amorphous barrier, a crystalline barrier, or some other suitable insulating and/or tunnel barrier material. The amorphous barrier may be or comprise, for example, aluminum oxide (e.g., $AlO_x$), titanium oxide (e.g., $TiO_x$), or some other suitable amorphous barrier. The crystalline barrier may, for example, be or comprise manganese oxide (e.g., MgO), spinel (e.g., $MgAl_2O_4$), or some other suitable crystalline barrier.

Figure 14:
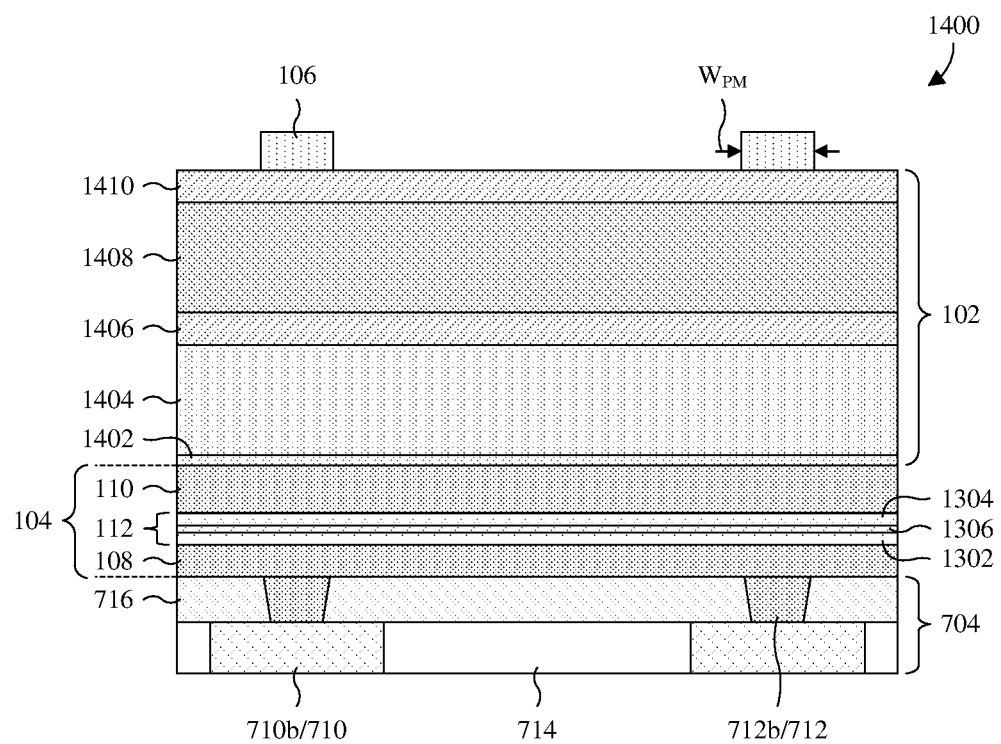

As illustrated by the cross-sectional view 1400 of FIG. 14, a hard mask film 102 is deposited over the memory film 104. The hard mask film 102 comprises a plurality of hard mask layers, including a first dielectric hard mask layer 1402, a conductive hard mask layer 1404, a second dielectric hard mask layer 1406, a carbon hard mask layer 1408, and a third dielectric hard mask layer 1410. The conductive hard mask layer 1404 overlies the first dielectric hard mask layer 1402, and the second and third dielectric hard mask layers 1406, 1410 overlie the conductive hard mask layer 1404. Further, the carbon hard mask layer 1408 is vertically between the second and third dielectric hard mask layers 1406, 1410. In alternative embodiments, any one or more of the hard mask layers is/are omitted.

The conductive hard mask layer 1404 is or comprises metal and may, for example, be or comprise tantalum nitride and/or some other suitable conductive material comprising metal. In some embodiments, the conductive hard mask layer 1404 is a metal hard mask layer. The second and third dielectric hard mask layers 1406, 1410 may, for example, be or comprise silicon oxynitride and/or some other suitable dielectric(s). The carbon hard mask layer 1408 may, for example, be or comprise amorphous carbon (e.g., AFP), diamond-like carbon (e.g., DLC), some other suitable carbon material, or any combination of the foregoing.

The first dielectric hard mask layer 1402 prevents Galvanic corrosion that would occur if the conductive hard mask layer 1404 and the top electrode layer 110 were in direct contact. Such Galvanic corrosion could lead to shrinking, necking, or bending of the conductive hard mask layer 1404 during subsequent etching (e.g., the first etch described with regard to FIG. 15), such that first dielectric hard mask layer 1402 prevents shrinking, necking, and bending of the conductive hard mask layer 1404. The first dielectric hard mask layer 1402 may, for example, be or comprise oxide and/or some other suitable dielectric(s).

Also illustrated by the cross-sectional view 1400 of FIG. 14, a plurality of photoresist masks 106 are formed over the hard mask film 102. The photoresist masks 106 are individual to memory cells being formed and may, for example, be formed by photolithography or some other suitable process. In some embodiments, the photoresist masks 106 have individual widths WPM that are less than about 65 nanometers, about 55 nanometers, or some other suitable value and/or that are between about 45-65 nanometers or some other suitable range.

Figure 15:
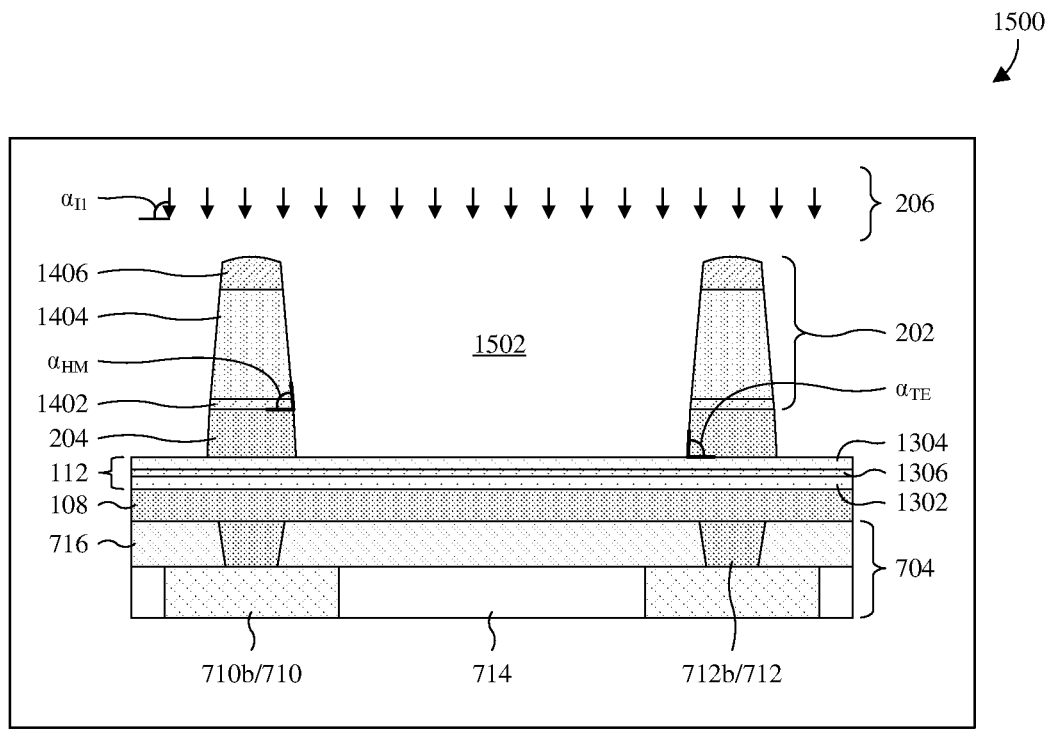

As illustrated by the cross-sectional view 1500 of FIG. 15, a first etch is performed into the hard mask film 102 (see, e.g., FIG. 14) and the top electrode layer 110 (see, e.g., FIG. 14) with the photoresist masks 106 (see, e.g., FIG. 14) in place and stops on the data storage film 112. In alternative embodiments, the first etch stops on the top electrode layer 110. The first etch removes the photoresist masks 106, the third dielectric hard mask layer 1410 (see, e.g., FIG. 14), and the carbon hard mask layer 1408 (see, e.g., FIG. 14), while also thinning the second dielectric hard mask layer 1406. Further, the first etch forms a plurality of hard masks 202 and a plurality of top electrodes 204 respectively from the hard mask film 102 and the top electrode layer 110. The hard masks 202 and the top electrodes 204 are individual to the memory cells being formed, and the top electrodes 204 respectively underlie the hard masks 202.

The first etch is performed as described with regard to FIG. 2 in a first-etch process chamber 1502. For example, the first etch may be performed by anisotropic and/or dry etching in which the hard mask film 102 and the top electrode layer 110 are bombarded with ions 206 accelerated in a direction at an angle $\alpha_{I1}$ relative to bottom surfaces of the hard masks 202 and the top electrodes 204.

Upon completion of the first etch, the hard masks 202 and the top electrodes 204 have individual sidewalls that are substantially orthogonal to individual bottom surfaces respectively of the hard mask 202 and the top electrodes 204. By substantially orthogonal, it is meant that the sidewalls are at individual angles $\alpha_{HM}$, $\alpha_{TE}$ respectively relative to the bottom surfaces and that the angles $\alpha_{HM}$, $\alpha_{TE}$ are within about 5 degrees or some other suitable value of 90 degrees. In some embodiments, orthogonal or substantially orthogonal may also be regarded respectively as vertical or substantially vertical. The hard masks 202 and the top electrodes 204 may, for example, have profiles that are trapezoidal or some other suitable shape. In some embodiments, the hard masks 202 and the top electrodes 204 also have top layouts that are circular, non-limiting examples of which are shown in FIG. 8. In other embodiments, the hard masks 202 and the top electrodes 204 have top layouts that are square, rectangular, oval, or some other suitable shape.

Figure 16:
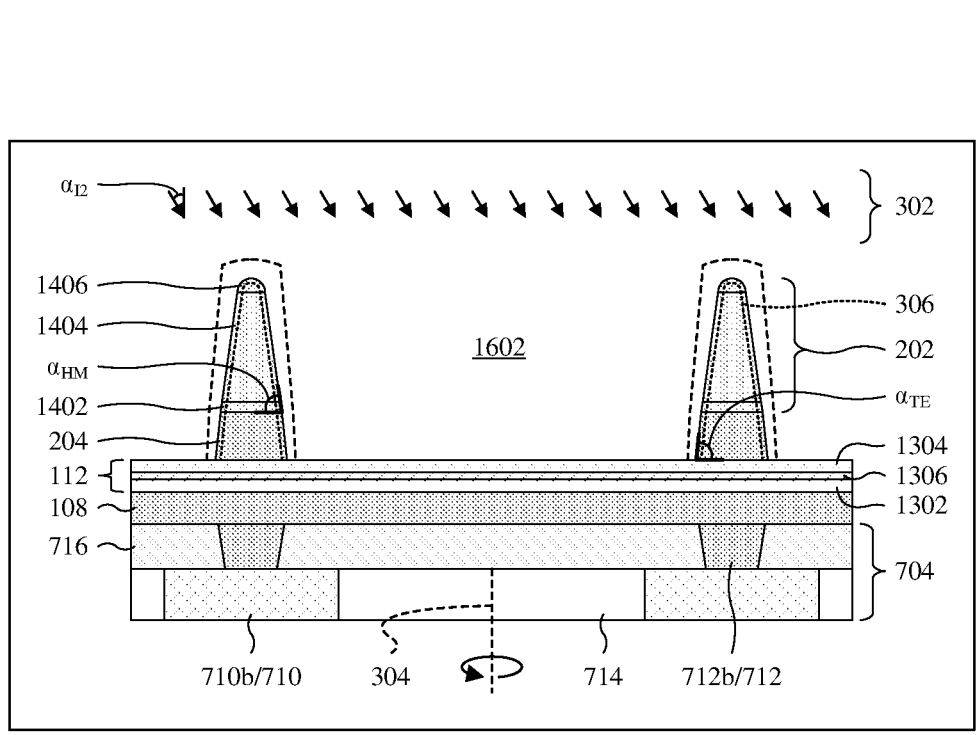

As illustrated by the cross-sectional view 1600 of FIG. 16, a trimming process is performed to decrease the angles $\alpha_{HM}$, $\alpha_{TE}$ between the sidewalls and the bottom surfaces. Note that outlines of the hard masks 202 and the top electrodes 204 before the trimming process are shown in phantom. In some embodiments, the trimming process further smooths the sidewalls, such that the sidewalls are free of notches. Because the angles $\alpha_{HM}$, $\alpha_{TE}$ are decreased, the hard masks 202 and the top electrodes 204 have profiles that are more tapered from bottom to top. The hard masks 202 and the top electrodes 204 may, for example, have profiles that are trapezoidal or some other suitable shape.

The trimming process is performed as described with regard to FIG. 3 in a trimming process chamber 1602. For example, the trimming process may be performed by IBE in which the sidewalls of the hard masks 202 and the top electrodes 204 are bombarded by ions 302 directed at an angle $\alpha_{I2}$ while the IC structure rotates about a central axis 304. In contrast with the angle $\alpha_{I1}$ at FIG. 15, the angle $\alpha_{I2}$ is less. In some embodiments, some of the ions 302 become embedded in the sidewalls of the hard masks 202 and the top electrodes 204 to define regions 306 lining the sidewalls. The regions 306 have an elevated concentration of the ions 302 relative to remainders of the hard masks 202 and the top electrodes 204. In other embodiments, none or a negligible amount of the ions 302 become embedded in the sidewalls and hence the regions 306 are omitted As illustrated by the cross-sectional view 1700 of FIG. 17, a second etch is performed into the data storage film 112 (see, e.g., FIG. 16) with the hard masks 202 in place and stops on the bottom electrode layer 108. In alternative embodiments, the second etch is also into the bottom electrode layer 108 to form a bottom electrode. The second etch removes the second dielectric hard mask layer 1406 (see, e.g., FIG. 16) and thins the conductive hard mask layer 1404. Further, the second etch forms data storage structures 402 individual to and respectively underlying the top electrodes 204. The data storage structures 402 comprise individual fixed elements 1002, individual free elements 1004, and individual barrier elements 1006 between the fixed and free elements 1002, 1004. In some embodiments, the data storage structures 402 have individual widths $W_{DS}$ that are about 40-65 nanometers, that are less than about 55 nanometers, or that are some other suitable value.

Figure 4:
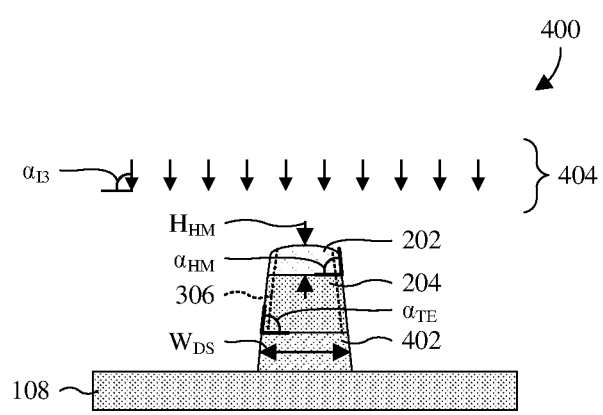

The second etch is performed as described with regard to FIG. 4 in a second-etch process chamber 1702. For example, the second etch may be performed by anisotropic and/or dry etching in which the data storage film 112 is bombarded with ions 404 accelerated in a direction at an angle $\alpha_{I3}$ relative to bottom surfaces of the hard masks 202 and the top electrodes 204.

Because the trimming process increases the taper of the hard masks 202, the hard masks 202 have less mass along a top of the hard masks 202. As a result, the hard masks 202 are structurally stronger and less prone to bending and/or collapse. This increases yields and/or width uniformity when the data storage structures 402 are formed in bulk using the hard masks 202. Further, because the trimming process increases the taper of the hard mask 202, the ions 404 have a higher likelihood of impinging on the sidewall of the hard mask 202 and the sidewall of the top electrode 204. Accordingly, removal efficiency of etched material along the sidewalls is higher and redeposition of etched material along the sidewalls is lower. Sidewall redeposition may include conductive material that may form a conductive bridge increasing leakage current between the fixed and free elements 1002, 1004. Therefore, by reducing sidewall redeposition, leakage current may be reduced. Further, yields may be increased when the data storage structures 402 are formed in bulk using the hard masks 202.

Figure 18:
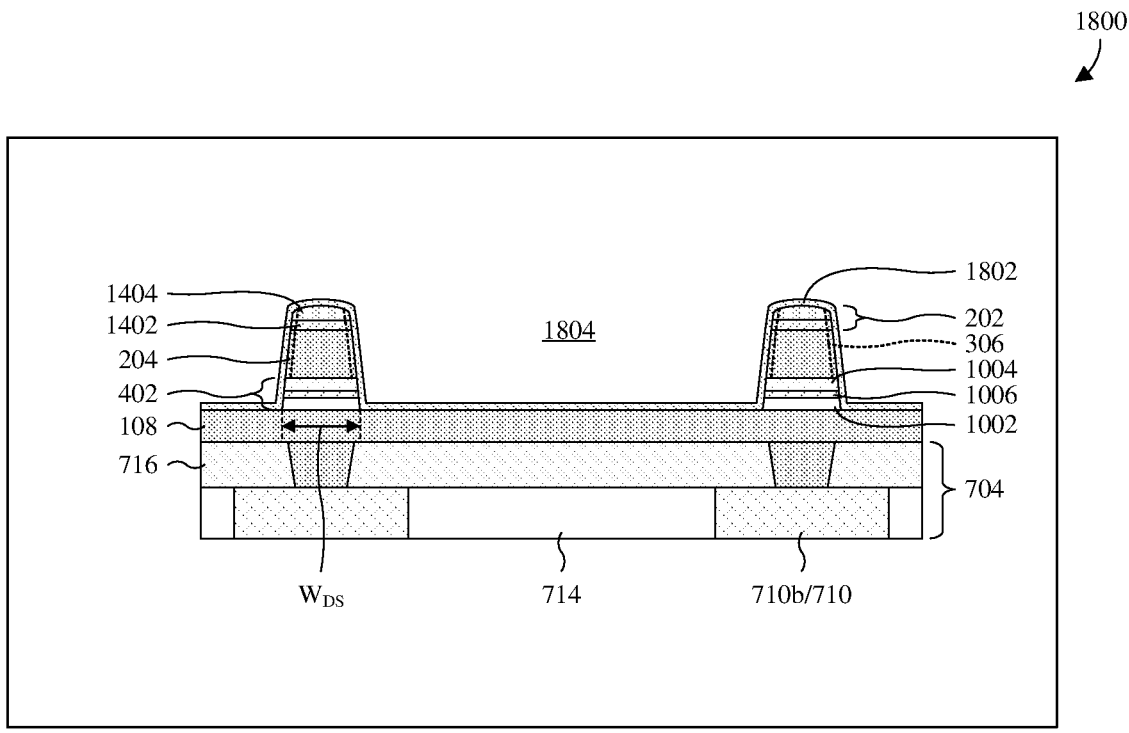

As illustrated by the cross-sectional view 1800 of FIG. 18, a sidewall spacer layer 1802 is deposited covering, and lining sidewalls of, the data storage structures 402. The sidewall spacer layer 1802 may, for example, be or comprise silicon nitride (e.g., $Si_3N_4$) and/or some other suitable dielectric(s). The deposition is performed within a deposition process chamber 1804 and may, for example, be performed by chemical vapor deposition (CVD) and/or some other suitable deposition process.

In some embodiments, the trimming process chamber 1602, the second-etch process chamber 1702, and the deposition process chamber 1804 are the same and different than the first-etch process chamber 1502. As such, the substrate 1102 (see, e.g., FIG. 12) is in the same process chamber from a beginning of the trimming process to an end of the deposition of the sidewall spacer layer 1802. In other words, the trimming process, the second etch, and the deposition of the sidewall spacer layer 1802 are performed in situ. This may, for example, be employed to prevent moisture from entering, and/or oxidation of, the data storage structures 402. In other embodiments, the first-etch process chamber 1502 and the trimming process chamber 1602 are the same, whereas the second-etch process chamber 1702 and the deposition process chamber 1804 are the same and different than the first-etch process chamber 1502 and the trimming process chamber 1602. As such, the first etch and the trimming process are performed in situ and then the second etch and the deposition of the sidewall spacer layer 1802 are performed in situ. In yet other embodiments, the first-etch process chamber 1502, the trimming process chamber 1602, the second-etch process chamber 1702, and the deposition process chamber 1804 are the same, such that the first and second etches, the trimming process, and the deposition of the sidewall spacer layer 1802 are performed in situ.

Figure 19:
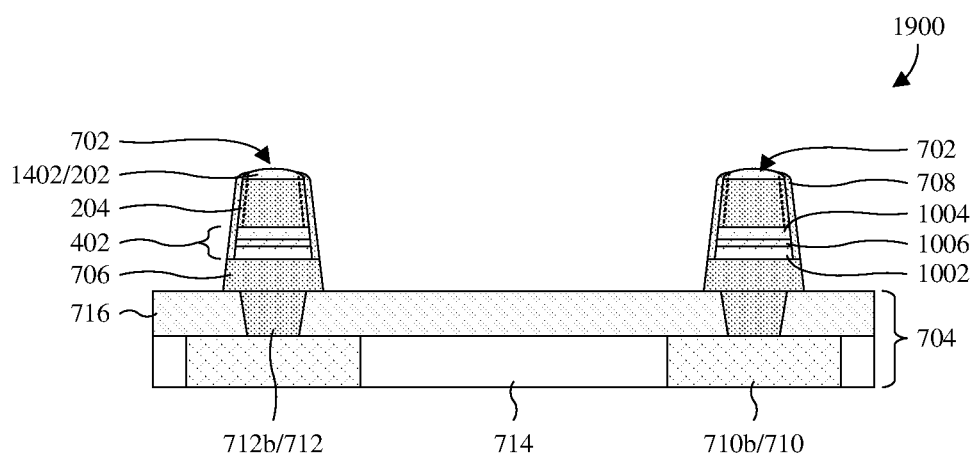

As illustrated by the cross-sectional view 1900 of FIG. 19, a third etch is performed into the sidewall spacer layer 1802 (see, e.g., FIG. 18) to etch back the sidewall spacer layer 1802 and to form sidewall spacers 708 individual to and respectively on the data storage structures 402. Further, a fourth etch is performed into the bottom electrode layer 108 (see, e.g., FIG. 18) to form bottom electrodes 706 individual to and respectively underlying the data storage structures 402. In some embodiments, the third and fourth etches are the same. In other embodiments, the third and fourth etches are independent of each other. In some embodiments, the third etch and/or the fourth etch removes the conductive hard mask layer 1404 (see, e.g., FIG. 18).

The bottom electrodes 706, the top electrode 204, and the data storage structures 402 define memory cells 702 individual to and respectively overlying the BEVAs 712b. Because the data storage structures 402 are MTJs, the memory cells 702 may also be regarded as MRAM cells. In alternative embodiments, the data storage structures 402 may be varied to form the memory cells 702 as RRAM cells or some other suitable type of memory cells.

Figure 20:
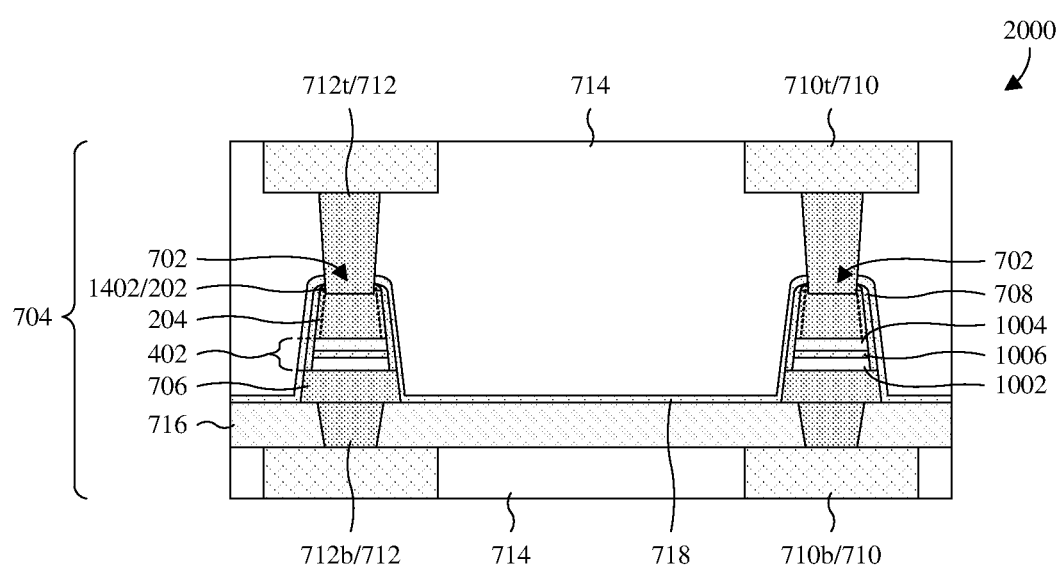

As illustrated by the cross-sectional view 2000 of FIG. 20, the interconnect structure 704 is completed over the memory cells 702. An etch stop layer 718 is deposited over and lining the memory cells 702 and another IMD layer 714 is deposited over the etch stop layer 718. Further, a plurality of additional wires 710 and a plurality of additional vias 712 are formed in the IMD layer 714. The plurality of additional wires 710 comprises top electrode wires 710t individual to and respectively overlying the memory cells 702. The plurality of additional vias 712 comprises TEVAs 712t individual to the memory cells 702 and extending respectively from the top electrode wires 710t respectively to the memory cells 702.

While FIGS. 12-20 are described with reference to a method, it will be appreciated that the structures shown in FIGS. 12-20 are not limited to the method but rather may stand alone separate of the method. While FIGS. 12-20 are described as a series of acts, it will be appreciated that the order of the acts may be altered in other embodiments. While FIGS. 12-20 illustrate and describe as a specific set of acts, some acts that are illustrated and/or described may be omitted in other embodiments. Further, acts that are not illustrated and/or described may be included in other embodiments.

Figure 21:
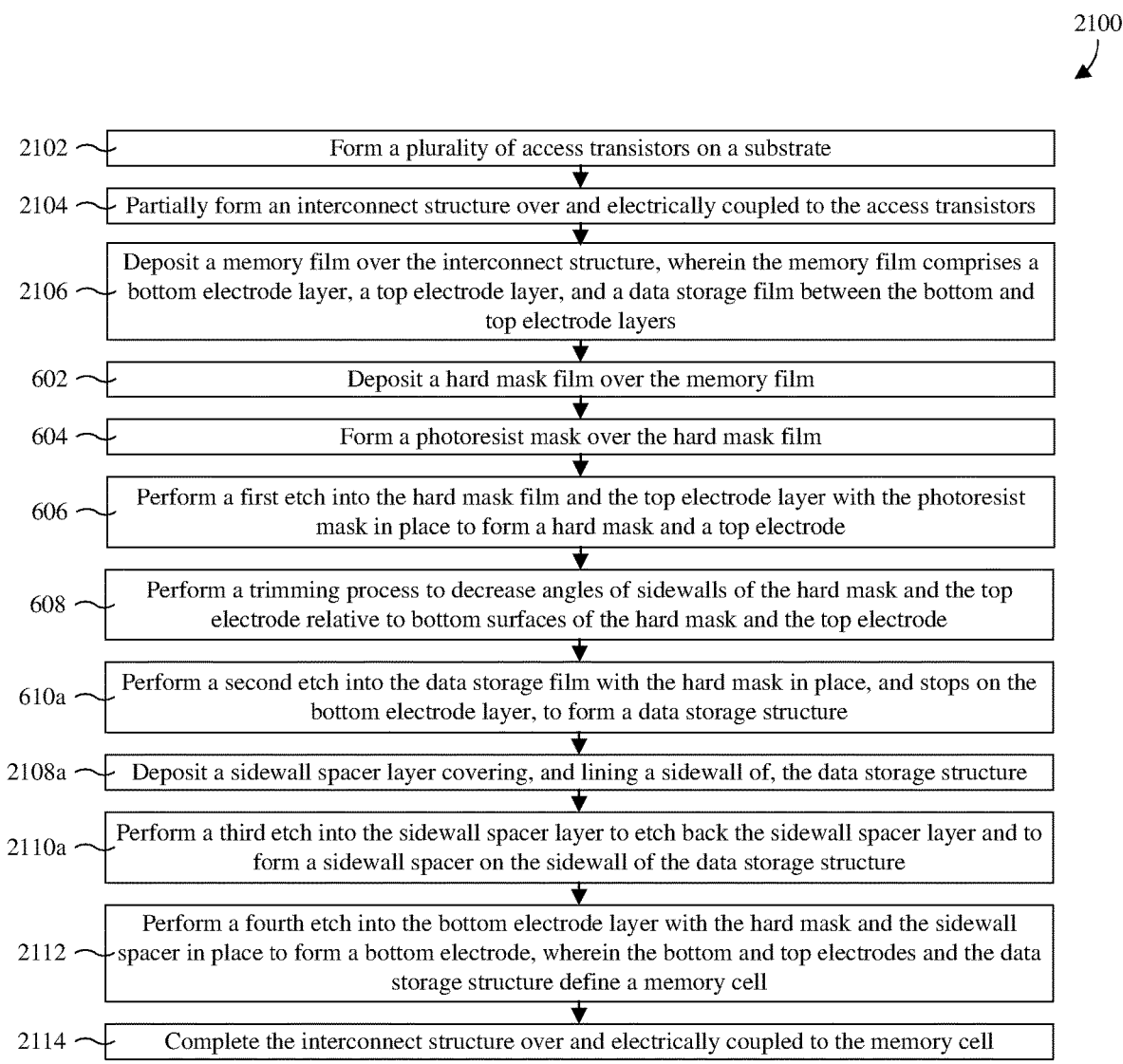
FIG. 21 illustrates a block diagram of some embodiments of the method of FIGS. 12-20.

With reference to FIG. 21, a block diagram 2100 of some embodiments of the method of FIGS. 12-20 is provided.

At 2102, a plurality of access transistors is formed on a substrate. See, for example, FIG. 12.

At 2104, an interconnect structure is partially formed over and electrically coupled to the access transistors. See, for example, FIG. 12.

At 2106, a memory film is deposited over the interconnect structure, wherein the memory film comprises a bottom electrode layer, a top electrode layer, and a data storage film between the bottom and top electrode layers. See, for example, FIG. 13.

At 602, a hard mask film is deposited over the memory film. See, for example, FIG. 14.

At 604, a photoresist mask is formed over the hard mask film. See, for example, FIG. 14.

At 606, a first etch is performed into the hard mask film and the top electrode layer with the photoresist mask in place to form a hard mask and a top electrode. See, for example, FIG. 15.

At 608, a trimming process is performed to decrease angles of sidewalls of the hard mask and the top electrode relative to bottom surfaces of the hard mask and the top electrode. See, for example, FIG. 16.

At 610a, a second etch is performed into the data storage film with the hard mask in place, and stops on the bottom electrode layer, to form a data storage structure. See, for example, FIG. 17.

At 2108a, a sidewall spacer layer is deposited covering, and lining a sidewall of, the data storage structure. See, for example, FIG. 18.

At 2110a, a third etch into the sidewall spacer layer to etch back the sidewall spacer layer and to form a sidewall spacer on the sidewall of the data storage structure. See, for example, FIG. 19.

At 2112, a fourth etch is performed into the bottom electrode layer with the hard mask and the sidewall spacer in place to form a bottom electrode, wherein the bottom and top electrodes and the data storage structure define a memory cell. See, for example, FIG. 19.

At 2114, the interconnect structure is completed over and electrically coupled to the memory cell. See, for example, FIG. 20.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 22-25, a series of cross-sectional views 2200-2500 of some alternative embodiments of the method of FIGS. 12-20 is provided in which the second etch extends into the bottom electrode layer 108. The acts leading up to the second etch are as described and illustrated with regard to FIGS. 12-16. Hence, FIGS. 22-25 replace FIGS. 17-20 and proceed from FIGS. 12-16 in the alternative embodiments.

Figure 22:
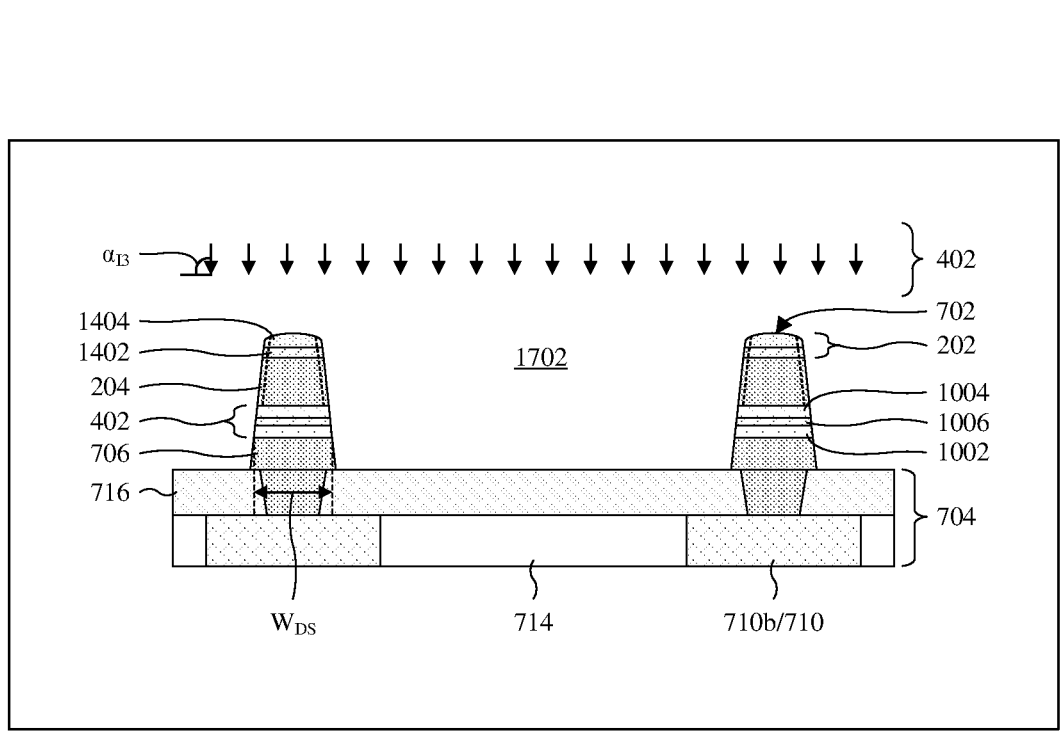
FIGS. 22-25 illustrate a series of cross-sectional views of some alternative embodiments of the method of FIGS. 12-20 in which a second etch extends into a bottom electrode layer.

As illustrated by the cross-sectional view 2200 of FIG. 22, the second etch is performed into the data storage film 112 (see, e.g., FIG. 16) and the bottom electrode layer 108 (see, e.g., FIG. 16). The second etch thins the conductive hard mask layer 1404 (see, e.g., FIG. 16) and further forms data storage structures 402 and bottom electrodes 706 individual to and respectively underlying the top electrodes 204. The second etch is as described with regard to FIG. 17 except for the bottom electrodes 706.

The bottom electrodes 706, the top electrodes 204, and the data storage structures 402 define memory cells 702 individual to and respectively overlying the BEVAs 712b. Because the data storage structures 402 are MTJs, the memory cells 702 may also be regarded as MRAM cells. In alternative embodiments, the data storage structures 402 may be varied to form the memory cells 702 as RRAM cells or some other suitable type of memory cells.

Figure 23:
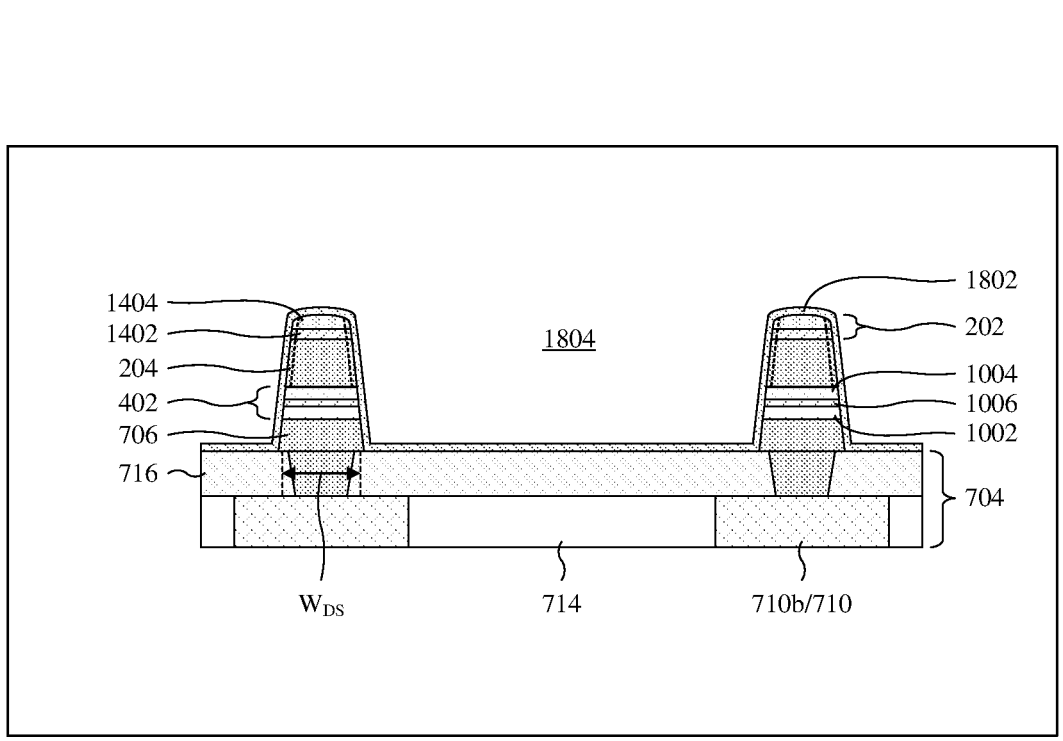

As illustrated by the cross-sectional view 2300 of FIG. 23, a sidewall spacer layer 1802 is deposited covering, and lining sidewalls of, the data storage structures 402 and the bottom electrodes 706. The depositing is as described with regard to FIG. 18 except for the bottom electrodes 706.

Figure 24:
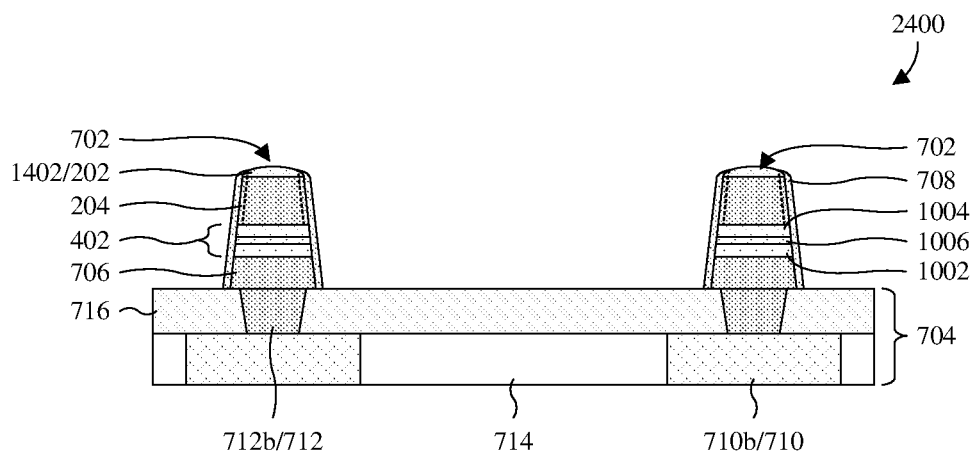

As illustrated by the cross-sectional view 2400 of FIG. 24, a third etch is performed to etch back the sidewall spacer layer 1802 (see, e.g., FIG. 23) to form sidewall spacers 708 on the data storage structures 402 and the bottom electrodes 706. The third etch is as described with regard to FIG. 19 except for the bottom electrodes 706.

Figure 25:
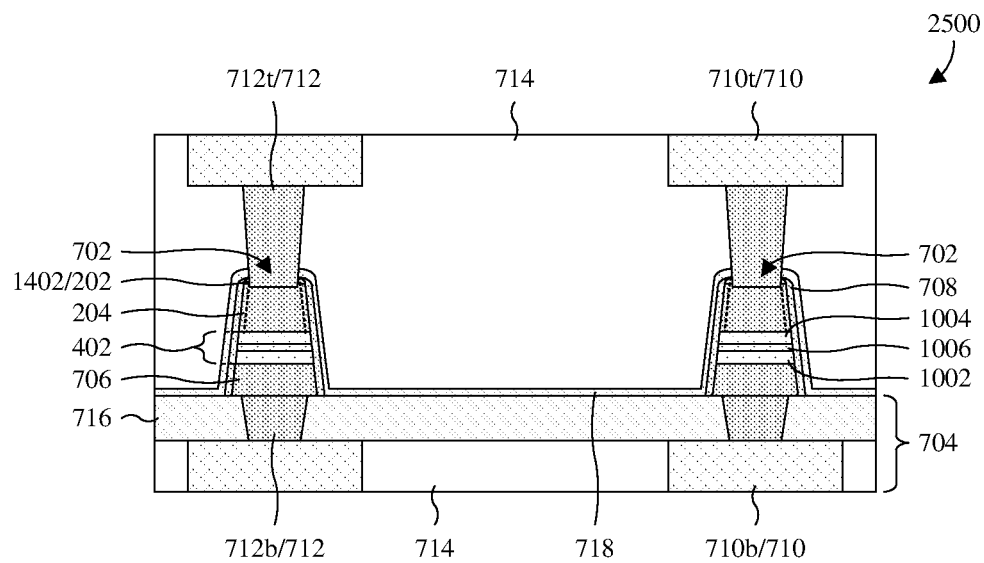

As illustrated by the cross-sectional view 2500 of FIG. 25, the interconnect structure 704 is completed over the memory cells 702 as described with regard to FIG. 20.

While FIGS. 22-25 are described with reference to a method, it will be appreciated that the structures shown in FIGS. 22-25 are not limited to the method but rather may stand alone separate of the method. While FIGS. 22-25 are described as a series of acts, it will be appreciated that the order of the acts may be altered in other embodiments. While FIGS. 22-25 illustrate and describe as a specific set of acts, some acts that are illustrated and/or described may be omitted in other embodiments. Further, acts that are not illustrated and/or described may be included in other embodiments.

Figure 26:
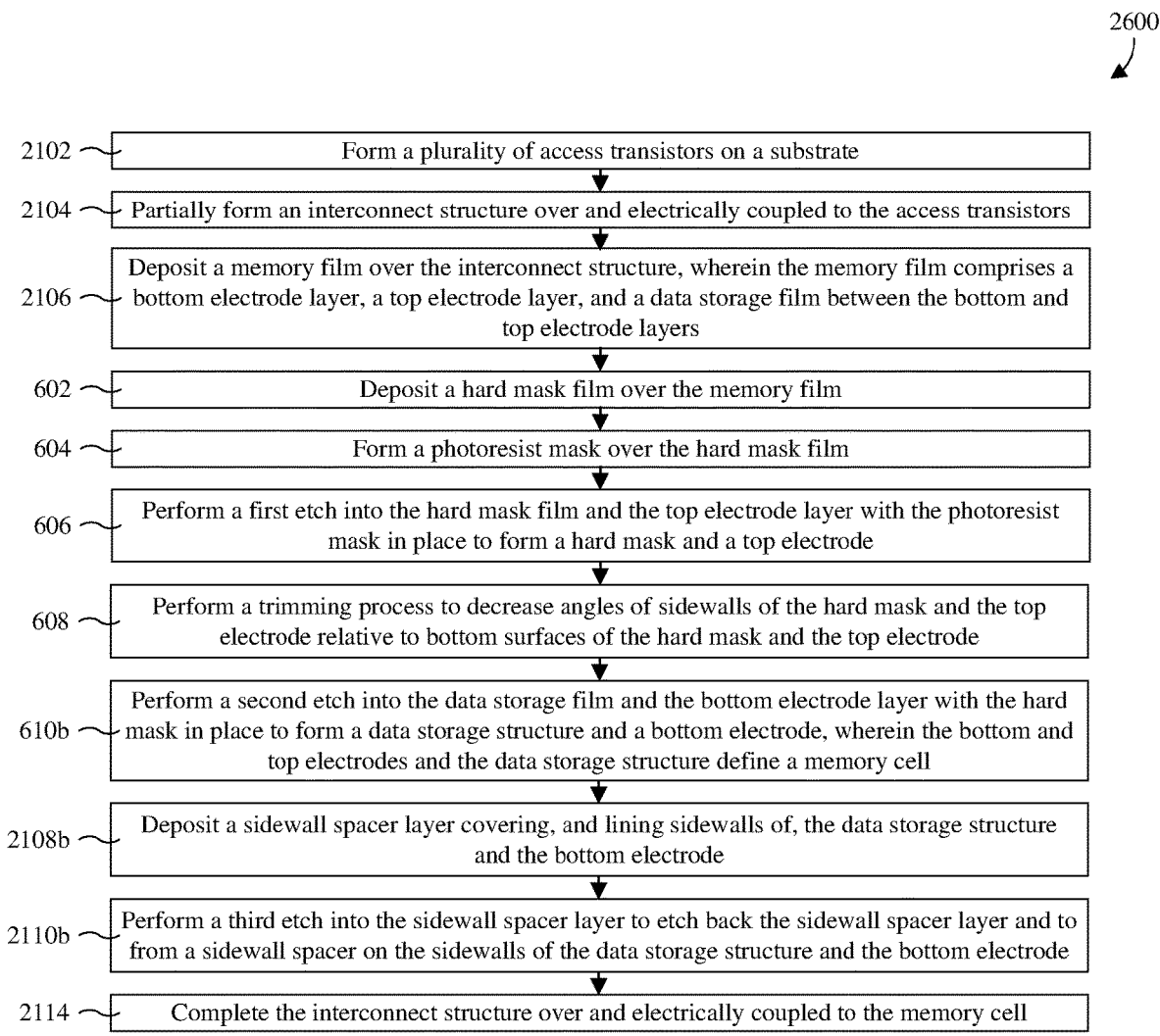
FIG. 26 illustrates a block diagram of some embodiments of the method of FIGS. 22-25.

With reference to FIG. 26, a block diagram 2600 of some embodiments of the method of FIGS. 22-25 is provided.

At 2102, a plurality of access transistors is formed on a substrate. See, for example, FIG. 12.

At 2104, an interconnect structure is partially formed over and electrically coupled to the access transistors. See, for example, FIG. 12.

At 2106, a memory film is deposited over the interconnect structure, wherein the memory film comprises a bottom electrode layer, a top electrode layer, and a data storage film between the bottom and top electrode layers. See, for example, FIG. 13.

At 602, a hard mask film is deposited over the memory film. See, for example, FIG. 14.

At 604, a photoresist mask is formed over the hard mask film. See, for example, FIG. 14.

At 606, a first etch is performed into the hard mask film and the top electrode layer with the photoresist mask in place to form a hard mask and a top electrode. See, for example, FIG. 15.

At 608, a trimming process is performed to decrease angles of sidewalls of the hard mask and the top electrode relative to bottom surfaces of the hard mask and the top electrode. See, for example, FIG. 16.

At 610b, a second etch is performed into the data storage film and the bottom electrode layer with the hard mask in place to form a data storage structure and a bottom electrode, wherein the bottom and top electrodes and the data storage structure define a memory cell. See, for example, FIG. 22.

At 2108b, a sidewall spacer layer is deposited covering, and lining sidewalls of, the data storage structure and the bottom electrode. See, for example, FIG. 23.

At 2110b, a third etch is performed into the sidewall spacer layer to etch back the sidewall spacer layer and to form a sidewall spacer on the sidewalls of the data storage structure and the bottom electrode. See, for example, FIG. 24.

At 2114, the interconnect structure is completed over and electrically coupled to the memory cell. See, for example, FIG. 25.

While the block diagram 2600 of FIG. 26 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 17:
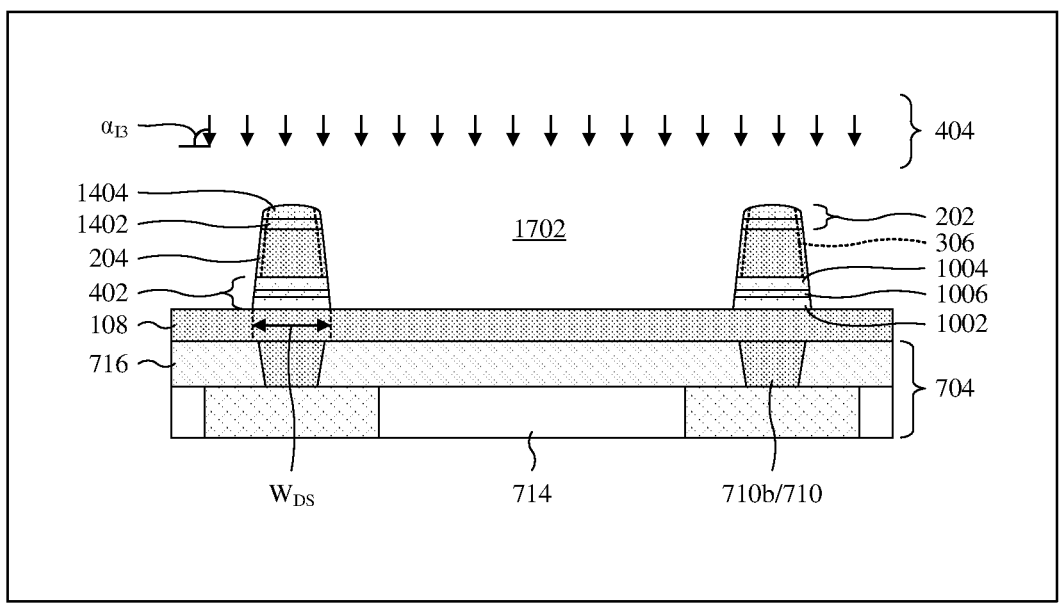
Figure 27:
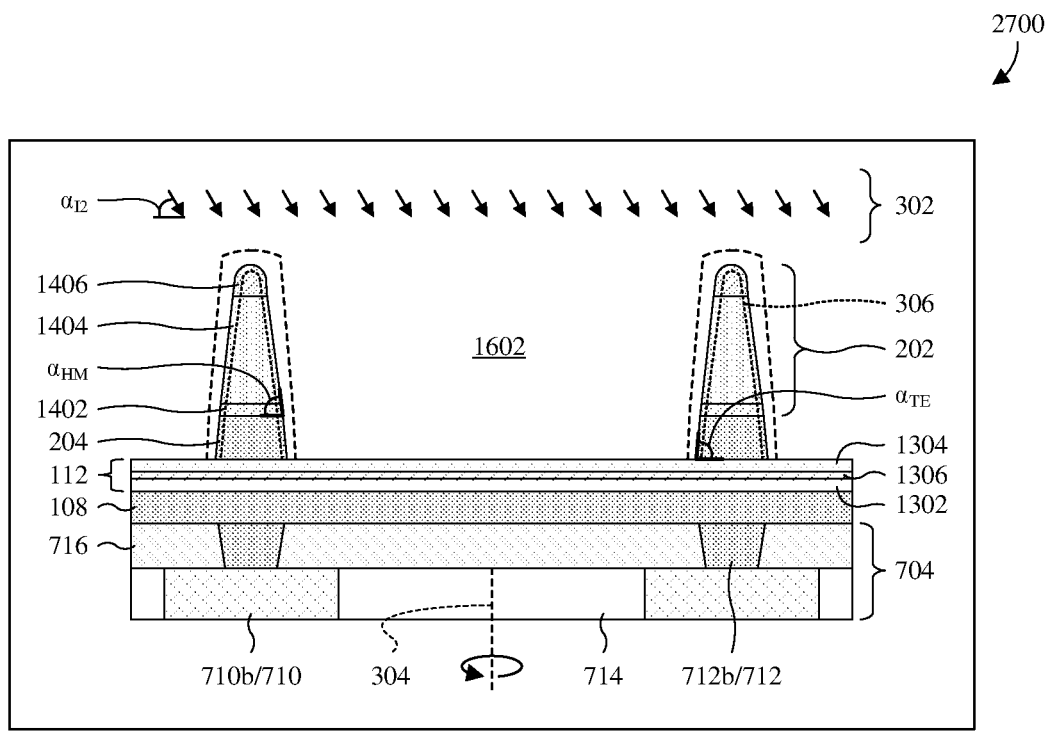
FIGS. 27 and 28 illustrate cross-sectional views of some alternative embodiments of the structures respectively in FIGS. 16 and 17.
Figure 28:
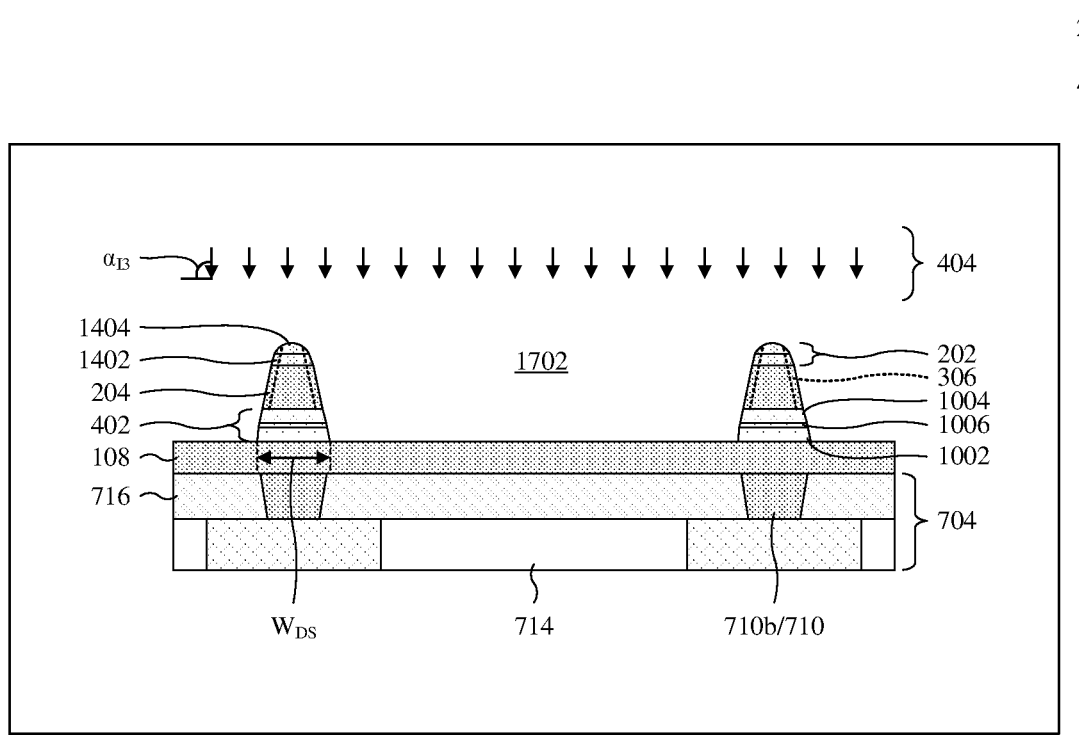

With reference to FIGS. 27 and 28, cross-sectional views 2700, 2800 of some alternative embodiments of the structures respectively in FIGS. 16 and 17 are provided in which profiles of the hard masks 202, the top electrodes 204, and the data storage structures 402 are varied.

In some embodiments, the present disclosure provides a method for forming a memory cell, the method including: depositing a memory film over a substrate, wherein the memory film includes a bottom electrode layer, a top electrode layer, and a data storage film between the top and bottom electrode layers; depositing a hard mask film over the memory film; patterning the top electrode layer and the hard mask film to respectively form a top electrode and a hard mask over the top electrode; performing a trimming process to decrease a sidewall angle between a sidewall of the hard mask and a bottom surface of the hard mask; and performing an etch into the data storage film with the hard mask in place after the trimming process to form a data storage structure underlying the top electrode. In some embodiments, the sidewall angle is greater than about 85 degrees before the trimming process and is less than about 82 degrees after the trimming process. In some embodiments the trimming process includes IBE. In some embodiments, the trimming process includes bombarding the sidewall with ions accelerated in a direction, wherein the direction is at an ion angle relative to an axis orthogonal to the bottom surface of the hard mask, and wherein the ion angle is about 35-90 degrees. In some embodiments, the trimming process includes bombarding the sidewall with ions for about 60-80 seconds. In some embodiments, the trimming process includes generating plasma from an inert gas and accelerating ions from the plasma towards the sidewall of the hard mask. In some embodiments, the trimming process and the etch are performed within a common process chamber. In some embodiments, the patterning of the top electrode layer and the hard mask film includes: forming a photoresist mask over the hard mask film; and performing an additional etch into the hard mask film and the top electrode layer with the photoresist mask in place.

In some embodiments, the present disclosure provides another method for forming a memory cell, the method including: depositing a memory film over a substrate, wherein the memory film includes a bottom electrode layer, a top electrode layer, and a data storage film between the top and bottom electrode layers; depositing a hard mask film over the memory film; patterning the hard mask film to form a hard mask; after the patterning, bombarding a hard mask sidewall of the hard mask with ions directed at an ion angle relative to an axis orthogonal to a bottom surface of the hard mask; and performing an etch into the data storage film with the hard mask in place to form a data storage structure underlying the hard mask. In some embodiments, the method further includes depositing a spacer layer lining the hard mask sidewall of the hard mask and a data storage sidewall of the data storage structure, wherein the depositing of the spacer layer and the bombarding are performed within a common process chamber. In some embodiments, the bombarding is performed for 70 seconds, wherein the ion angle is about 50 degrees. In some embodiments, the bombarding slants the hard mask sidewall, such that the hard mask sidewall is at an angle of about 75-82 degrees relative to the bottom surface of the hard mask upon completion of the bombarding. In some embodiments, the bombarding includes generating plasma from a process gas, wherein the process gas includes helium, argon, krypton, xenon, or any combination of the foregoing. In some embodiments, the method further includes patterning the top electrode layer to form a top electrode underlying the hard mask, wherein the patterning of top electrode layer and the patterning of the hard mask film are performed together using a common etch. In some embodiments, the bombarding further bombards a top electrode sidewall of the top electrode, and wherein the top electrode sidewall is angled relative to a bottom surface of the top electrode at a greater angle than the hard mask sidewall is angled relative to the bottom surface of the hard mask.

In some embodiments, the present disclosure provides an IC including: an interconnect structure including an alternating stack of wires and vias, wherein the vias include a BEVA and a TEVA; and a memory cell in the interconnect structure and including: a bottom electrode overlying the BEVA; a MTJ overlying the bottom electrode; and a top electrode overlying the MTJ and underlying the TEVA, wherein a sidewall of the top electrode is oriented at an angle of about 75-82 degrees relative to a bottom surface of the top electrode. In some embodiments, a width of the MTJ is less than about 55 nanometers. In some embodiments, the top electrode has an elevated concentration of inert ions extending along the sidewall from the bottom surface of the top electrode to a top surface of the bottom electrode. In some embodiments, the IC further includes a hard mask overlying the top electrode and including a dielectric material, wherein the TEVA extends through the hard mask. In some embodiments, the MTJ and the top electrode define a common sidewall that is smooth from top to bottom.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
an interconnect structure comprising an alternating stack of wires and vias, wherein the wires comprise a bottom electrode wire and a top electrode wire; and
a memory cell comprising:
a bottom electrode overlying the bottom electrode wire;
a data storage layer overlying the bottom electrode; and
a top electrode overlying the data storage layer and underlying the top electrode wire, wherein a sidewall of the top electrode is oriented at an angle of less than 82 degrees relative to a bottom surface of the top electrode, wherein the angle faces an interior of the top electrode in a cross-sectional plane, and wherein the data storage layer and the top electrode form a common sidewall that is smooth from top to bottom.

2. The semiconductor device structure according to claim 1, wherein the angle is greater than 75 degrees.

3. The semiconductor device structure according to claim 1, wherein the top electrode has a higher concentration of inert ions at the sidewall of the top electrode than at a center of the top electrode and at a sidewall of the data storage layer.

4. The semiconductor device structure according to claim 1, wherein the data storage layer is a magnetic tunnel junction (MTJ).

5. The semiconductor device structure according to claim 1, wherein the vias comprise a bottom electrode via (BEVA) between and bordering the bottom electrode wire and the bottom electrode.

6. The semiconductor device structure according to claim 1, wherein the angle is greater than 75 degrees, the top electrode has a higher concentration of inert ions at the sidewall of the top electrode than at a center of the top electrode and at a sidewall of the data storage layer, the data storage layer is a magnetic tunnel junction (MTJ), and a width of the MTJ is less than about 55 nanometers.

7. A semiconductor device structure, comprising:
an interconnect structure comprising an alternating stack of wires and vias; and
a memory cell comprising:
a bottom electrode overlying a lower portion of the interconnect structure;
a data storage layer overlying the bottom electrode; and
a top electrode overlying the data storage layer and underlying an upper portion of the interconnect structure, wherein the top electrode has a first concentration of ions at a sidewall of the top electrode, and wherein the first concentration is higher than a second concentration of the ions that the top electrode has at a width-wise center of the top electrode.

8. The semiconductor device structure according to claim 7, wherein the top electrode has a peripheral region at the sidewall of the top electrode and with the first concentration of the ions, wherein the top electrode further has an interior region at the width-wise center of the top electrode and with the second concentration of the ions, and wherein the peripheral region extends in a closed path around the interior region.

9. The semiconductor device structure according to claim 7, wherein the top electrode has multiple different types of inert ions that are at the sidewall of the top electrode and that are localized to a periphery of the top electrode, and wherein the ions of the first concentration correspond to the multiple different types of the inert ions.

10. The semiconductor device structure according to claim 7, wherein the data storage layer has a third concentration of the ions at a sidewall of the data storage layer that neighbors the sidewall of the top electrode, and wherein the second concentration of the ions is greater than the third concentration of the ions.

11. The semiconductor device structure according to claim 7, wherein the ions are inert ions.

12. The semiconductor device structure according to claim 7, wherein the data storage layer has a width of about 55-65 nanometers.

13. The semiconductor device structure according to claim 7, wherein the top electrode and the data storage layer form a common sidewall, and wherein the semiconductor device structure further comprises:
a sidewall spacer on the common sidewall and overlying the bottom electrode.

14. A semiconductor device structure, comprising:
an interconnect structure comprising an alternating stack of wires and vias;
a magnetic tunnel junction (MTJ) overlying a lower portion of the interconnect structure;
a top electrode overlying the MTJ; and
a hard mask overlying the top electrode, wherein a sidewall of the hard mask is oriented at an angle of about 75-82 degrees relative to a bottom surface of the hard mask, and wherein the angle faces an interior of the hard mask in a cross-sectional plane.

15. The semiconductor device structure according to claim 14, wherein a sidewall of the top electrode is oriented at an additional angle relative to a bottom surface of the top electrode, and wherein the additional angle faces an interior of the top electrode in the cross-sectional plane and is greater than the angle of the hard mask.

16. The semiconductor device structure according to claim 14, wherein the hard mask comprises dielectric material and metal.

17. The semiconductor device structure according to claim 14, further comprising:
 a ring-shaped region in the hard mask and the top electrode, wherein the ring-shaped region is at a periphery of the hard mask and the top electrode and surrounds an interior region of the hard mask and the top electrode, and wherein the ring-shaped region has a concentration of ions that is higher than a concentration of the ions at the interior region.

18. The semiconductor device structure according to claim 14, wherein a width of the MTJ is less than about 55 nanometers.

19. The semiconductor device structure according to claim 1, further comprising:
 a sidewall spacer structure overlying the bottom electrode and extending from the bottom electrode, along a sidewall of the data storage layer and the sidewall of the top electrode, to a top of the top electrode.

20. The semiconductor device structure according to claim 14, wherein the hard mask is spaced from the MTJ by the top electrode.

* * * * *